US008598602B2

(12) United States Patent
Hussell et al.

(10) Patent No.: US 8,598,602 B2
(45) Date of Patent: Dec. 3, 2013

(54) LIGHT EMITTING DEVICE PACKAGES WITH IMPROVED HEAT TRANSFER

(75) Inventors: Christopher P. Hussell, Cary, NC (US); Sung Chul Joo, Raleigh, NC (US); Robert S. Pyles, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 653 days.

(21) Appl. No.: 12/825,075

(22) Filed: Jun. 28, 2010

(65) Prior Publication Data

US 2011/0031865 A1 Feb. 10, 2011

Related U.S. Application Data

(63) Continuation-in-part of application No. 12/479,318, filed on Jun. 5, 2009, now Pat. No. 7,923,739, and a continuation-in-part of application No. 29/330,657, filed on Jan. 12, 2009, now Pat. No. Des. 621,799, and a continuation-in-part of application No. 29/353,652, filed on Jan. 12, 2010, now Pat. No. Des. 635,527, and a continuation-in-part of application No. 29/338,186, filed on Jun. 5, 2009, now Pat. No. Des. 641,719, and a continuation-in-part of application No. 29/360,791, filed on Apr. 30, 2010, now Pat. No. Des. 648,686.

(51) Int. Cl.
*H01L 33/64* (2010.01)

(52) U.S. Cl.
USPC ............................................................ 257/88

(58) Field of Classification Search
USPC ..................... 257/88, 99, E21.499, E33.056
See application file for complete search history.

(56) References Cited

U.S. PATENT DOCUMENTS

| 4,679,118 A | 7/1987 | Johnson et al. |
| 4,946,547 A | 8/1990 | Palmour |
| 5,200,022 A | 4/1993 | Kong |
| 5,210,051 A | 5/1993 | Carter, Jr. |
| RE34,861 E | 2/1995 | Davis et al. |

(Continued)

FOREIGN PATENT DOCUMENTS

| CN | 200930286397.5 | 10/2010 |
| CN | ZL 2011-30010728 | 1/2012 |

(Continued)

OTHER PUBLICATIONS

Taiwanese Office Action for Appl. No. 099305566 dated Jul. 12, 2011.

(Continued)

*Primary Examiner* — Roy Potter
(74) *Attorney, Agent, or Firm* — Jenkins, Wilson, Taylor & Hunt, P.A.

(57) ABSTRACT

Packages containing one or more light emitting devices, such as light emitting diodes (LEDs), are disclosed. In one embodiment, LED package can include a thermal element having improved solder reliability to improve heat dissipation capacity of the LED package. LED package can include a molded plastic body having one or more LEDs attached to one or more electrical elements. The LEDs can be connected to an upper surface of the thermal element. The thermal element can include a bottom surface which can extend further away in distance from a body of the LED package than a bottom surface of the electrical element. This configuration can result in an improved connection between the LED package and an external circuitry source, thereby increasing heat transfer ability of the LED package.

56 Claims, 14 Drawing Sheets

(56) References Cited

U.S. PATENT DOCUMENTS

| | | |
|---|---|---|
| 5,393,993 A | 2/1995 | Edmond |
| 5,506,446 A | 4/1996 | Hoffman et al. |
| 5,523,589 A | 6/1996 | Edmond |
| 6,274,924 B1 | 8/2001 | Carey et al. |
| 6,610,563 B1 | 8/2003 | Waitl |
| 6,828,170 B2 | 12/2004 | Roberts et al. |
| 6,936,855 B1 | 8/2005 | Harrah |
| 6,943,433 B2 | 9/2005 | Kamada |
| D514,073 S | 1/2006 | Suenaga |
| 7,081,661 B2 | 7/2006 | Takehara et al. |
| 7,224,047 B2 | 5/2007 | Carberry et al. |
| 7,244,965 B2 | 7/2007 | Andrews et al. |
| D566,055 S | 4/2008 | Kim |
| 7,361,940 B2 | 4/2008 | Kim et al. |
| D573,113 S | 7/2008 | Bando |
| D573,114 S | 7/2008 | Min et al. |
| 7,400,049 B2 | 7/2008 | Shim |
| 7,429,790 B2 | 9/2008 | Condie et al. |
| 7,432,589 B2 | 10/2008 | Yamamoto et al. |
| D580,375 S | 11/2008 | Yen |
| D580,381 S | 11/2008 | Bando |
| D580,891 S | 11/2008 | Sung et al. |
| 7,456,499 B2 | 11/2008 | Loh |
| 7,462,870 B2 | 12/2008 | Nakashima |
| D584,699 S | 1/2009 | Bando |
| D594,827 S | 6/2009 | Loh et al. |
| D595,675 S | 7/2009 | Wang et al. |
| 7,564,180 B2 | 7/2009 | Brandes |
| 7,566,159 B2 * | 7/2009 | Oon et al. ................ 362/612 |
| D597,968 S | 8/2009 | Kobayakawa et al. |
| D597,971 S | 8/2009 | Kobayakawa et al. |
| D598,400 S | 8/2009 | Bando |
| 7,592,638 B2 | 9/2009 | Kim |
| 7,659,551 B2 | 2/2010 | Loh |
| D614,592 S | 4/2010 | Hussell et al. |
| 7,692,206 B2 | 4/2010 | Loh |
| D615,504 S | 5/2010 | Keller et al. |
| 7,719,024 B2 | 5/2010 | Bando |
| D621,798 S | 8/2010 | Lu et al. |
| D621,799 S | 8/2010 | Hussell et al. |
| D622,680 S | 8/2010 | Lin et al. |
| 7,791,061 B2 | 9/2010 | Edmond et al. |
| D626,095 S | 10/2010 | Hsieh |
| D627,310 S | 11/2010 | Lin et al. |
| D628,541 S | 12/2010 | Lin |
| D632,267 S | 2/2011 | Chen et al. |
| D632,659 S | 2/2011 | Hsieh |
| D634,284 S | 3/2011 | Ko et al. |
| D634,285 S | 3/2011 | Ko et al. |
| D634,286 S | 3/2011 | Ko et al. |
| D634,716 S | 3/2011 | Suzuki |
| D635,527 S | 4/2011 | Hussell et al. |
| 7,923,739 B2 * | 4/2011 | Hussell .................. 257/88 |
| D641,719 S | 7/2011 | Hussell et al. |
| D643,819 S | 8/2011 | Joo |
| D648,686 S | 11/2011 | Hussell et al. |
| D648,687 S | 11/2011 | Joo et al. |
| D658,599 S | 5/2012 | Takahashi et al. |
| D659,657 S | 5/2012 | Hussell et al. |
| D661,264 S | 6/2012 | Joo et al. |
| D667,801 S | 9/2012 | Joo et al. |
| 8,269,244 B2 | 9/2012 | Hussell |
| 2001/0045640 A1 | 11/2001 | Oida et al. |
| 2002/0004251 A1 | 1/2002 | Roberts et al. |
| 2004/0075100 A1 | 4/2004 | Bogner et al. |
| 2004/0079957 A1 | 4/2004 | Andrews et al. |
| 2004/0126913 A1 | 7/2004 | Loh |
| 2006/0118808 A1 | 6/2006 | Ishidu et al. |
| 2006/0157726 A1 | 7/2006 | Loh et al. |
| 2006/0186418 A1 | 8/2006 | Edmond et al. |
| 2006/0220050 A1 | 10/2006 | Higaki et al. |
| 2007/0052074 A1 | 3/2007 | Hasegawa |
| 2007/0057364 A1 | 3/2007 | Wang et al. |
| 2007/0075325 A1 | 4/2007 | Baek et al. |
| 2007/0114514 A1 | 5/2007 | Ito |
| 2008/0006837 A1 | 1/2008 | Park et al. |
| 2008/0023722 A1 | 1/2008 | Lee et al. |
| 2008/0185605 A1 | 8/2008 | Wada et al. |
| 2008/0258130 A1 | 10/2008 | Bergmann et al. |
| 2008/0258162 A1 | 10/2008 | Koung et al. |
| 2008/0278941 A1 | 11/2008 | Logan et al. |
| 2008/0290353 A1 | 11/2008 | Medendorp et al. |
| 2009/0008662 A1 | 1/2009 | Ashdown et al. |
| 2009/0101921 A1 | 4/2009 | Lai |
| 2009/0159905 A1 | 6/2009 | Chen |
| 2009/0189178 A1 | 7/2009 | Kim et al. |
| 2009/0267085 A1 | 10/2009 | Lee et al. |
| 2009/0321779 A1 | 12/2009 | Kim et al. |
| 2010/0059783 A1 | 3/2010 | Chandra |
| 2010/0102345 A1 | 4/2010 | Kong et al. |
| 2010/0133554 A1 | 6/2010 | Hussell |
| 2010/0133578 A1 | 6/2010 | Pickard et al. |
| 2010/0155748 A1 | 6/2010 | Chan et al. |
| 2010/0163887 A1 | 7/2010 | Kim et al. |
| 2010/0181582 A1 | 7/2010 | Li et al. |
| 2010/0270577 A1 | 10/2010 | Rulkens et al. |
| 2011/0006658 A1 | 1/2011 | Chan |
| 2011/0180827 A1 | 7/2011 | Hussell |
| 2011/0186873 A1 | 8/2011 | Emerson |
| 2012/0127720 A1 | 5/2012 | Hussell et al. |
| 2012/0153317 A1 | 6/2012 | Emerson et al. |
| 2013/0003375 A1 | 1/2013 | Hussell |
| 2013/0011946 A1 | 1/2013 | Hussell |

FOREIGN PATENT DOCUMENTS

| | | |
|---|---|---|
| EP | 001242234 | 1/2011 |
| EP | 2 438 631 | 4/2012 |
| JP | D1102760 | 3/2001 |
| JP | 2005-179147 | 7/2005 |
| JP | 2005-209763 | 8/2005 |
| JP | 2007-108547 | 4/2007 |
| JP | 2008-091792 | 4/2008 |
| JP | 2008-103480 | 5/2008 |
| JP | 2008-545269 | 12/2008 |
| JP | D1346959 | 12/2008 |
| JP | 2010-034262 | 2/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| KR | 1020070000130 A | 1/2007 |
| KR | 10-0845856 | 7/2008 |
| KR | 1020090003378 A | 1/2009 |
| TW | 100305347 | 3/2012 |
| TW | D146222 | 4/2012 |
| TW | D148144 | 7/2012 |
| WO | WO 2007/126720 | 11/2007 |
| WO | WO 2008/021268 | 2/2008 |
| WO | WO 2010/141215 | 3/2011 |
| WO | WO 2012/005984 | 1/2012 |
| WO | WO 2012/021238 | 2/2012 |
| WO | WO 2012/050994 | 4/2012 |
| WO | WO 2012/100060 | 7/2012 |
| WO | WO 2012/106312 | 8/2012 |
| WO | WO 2012/109225 | 8/2012 |
| WO | WO 2012/151270 | 11/2012 |

OTHER PUBLICATIONS

Description Model No. N86x083x issued by Nichia Corporation—at least as early as Feb. 17, 2007.

Description Model No. NS6G083 issued by Nichia Corporation—at least as early as Aug. 31, 2007.

Design U.S. Appl. No. 29/338,186, filed Jun. 5, 2009.

Co-pending U.S. Appl. No. 12/498,856, filed Jul. 7, 2009.

Notice of Allowance from U.S. Appl. No. 29/330,657 dated Sep. 25, 2009.

Design U.S. Appl. No. 29/353,652, filed Jan. 12, 2010.

Notice of Allowance from U.S. Appl. No. 29/338,186 dated Apr. 16, 2010.

(56) References Cited

OTHER PUBLICATIONS

Design U.S. Appl. No. 29/360,791, filed Apr. 30, 2010.
Non-Final Office Action for U.S. Appl. No. 12/479,318 dated Jun. 2, 2010.
Related Design U.S. Appl. No. 29/365,939, filed Jul. 16, 2010.
U.S. Appl. No. 12/853,812, filed Aug. 10, 2010.
Notice of Allowance for U.S. Appl. No. 29/353,652 dated Aug. 24, 2010.
U.S. Appl. No. 61/404,985, filed Oct. 13, 2010.
Non-final Office Action for U.S. Appl. No. 12/479,318 dated Nov. 10, 2010.
Notice of Allowance for U.S. Appl. No. 29/353,652 dated Nov. 26, 2010.
Supplemental Notice of Allowance for U.S. Appl. No. 29/353,652 dated Dec. 8, 2010.
Related CIP U.S. Appl. No. 12/969,267, filed Dec. 15, 2010 (Filed With Non-Publication Request).
Notice of Allowance for U.S. Appl. No. 29/360,791 dated Dec. 22, 2010.
Notice of Allowance for U.S. Appl. No. 29/365,939 dated Dec. 27, 2010.
Related Design U.S. Appl. No. 29/382,394, filed Jan. 3, 2011.
International Search Report/Written Opinion dated Jan. 5, 2011 for PCT/US2010/035379.
U.S. Appl. No. 13/011,609, filed Jan. 21, 2011.
Supplemental Notice of Allowance for U.S. Appl. No. 29/360,791 dated Jan. 24, 2011.
Notice of Allowance for U.S. Appl. No. 12/479,318 dated Feb. 17, 2011.
Notice of Allowance for U.S. Appl. No. 29/338,186 dated Mar. 10, 2011.
Notice of Allowance for Japanese Design Appl. No. 2010-026186 dated Mar. 29, 2011.
Supplemental Notice of Allowability for U.S. Appl. No. 12/479,318 dated Apr. 5, 2011.
Notice of Allowance for Design U.S. Appl. No. 29/360,791 dated Apr. 12, 2011.
Notice of Allowance for Design U.S. Appl. No. 29/365,939 dated Apr. 12, 2011.
Supplemental Notice of Allowance for Design U.S. Appl. No. 29/338,186 dated May 20, 2011.
Notification of Grant for Chinese Application Serial No. CN 2011/30210595.0 dated Jan. 17, 2012.
Notification of Grant for Chinese Application Serial No. CN 2010-305787293.2 dated Jan. 19, 2012.
Notice of Allowance for U.S. Appl. No. 29/401,692 dated Jan. 20, 2012.
Notice of Allowance for U.S. Appl. No. 29/403,433 dated Feb. 2, 2012.
International Search Report for Application Serial No. TW 100305347 dated Mar. 5, 2012.
Japanese Notice of Allowance for Application Serial No. JP 2011-017747 dated Mar. 13, 2012.
Communication of European publication number and information on the application of Article 67(3) EPC dated Mar. 14, 2012.
Non-Final Office Action for U.S. Appl. No. 13/082,699 dated Apr. 13, 2012.
Notice of Allowance for U.S. Appl. No. 29/397,017 dated May 17, 2012.
Notice of Allowance for U.S. Appl. No. 12/853,812 dated May 21, 2012.
International Search Report and Written Opinion for Application Serial No. PCT/US2011/054560 dated May 22, 2012.
Restriction Requirement for U.S. Appl. No. 29/382,394 dated Jul. 17, 2012.
Notice of Allowance for U.S. Appl. No. 13/082,699 dated Oct. 23, 2012.
Non-Final Office Action for U.S. Appl. No. 13/462,450 dated Jan. 15, 2013.
Korean Notice of Allowance for Application No. 30-2010-0047049 dated Apr. 4, 2013.
Certificate of Registration for Community Design Application Serial No. 001283600-0001-0003 dated Jan. 7, 2011.
Japanese Office Action for JP2010-026185 dated Apr. 5, 2011.
Office Action with Restriction/Election Requirement for U.S. Appl. No. 12/853,812 dated Sep. 22, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812 dated Dec. 7, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.
Non-Final Office Action for Korean Application Serial No. KR 30-2010-0047048 dated Dec. 15, 2011.
Non-Final Office Action for Korean Application Serial No. KR 30-2010-0047049 dated Dec. 15, 2011.
Hyun-Ho Kim et al., Thermal Transient Characteristics of Die Attach in High Power LED PKG, Microelectronics Reliability, vol. 48, Issue 3, Mar. 2008, pp. 445-454.
Taiwanese Notice of Allowance for Application No. 100305347 dated Mar. 23, 2012.
International Search Report for Application Serial No. PCT/US2012/023285 dated Jun. 27, 2012.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/024122 dated Jul. 11, 2012.
Supplemental Notice of Allowance for U.S. Appl. No. 29/397,017 dated Jul. 23, 2012.
Notification Concerning Availability of the Publication Serial No. PCT/US2012/023285 dated Aug. 9, 2012.
Notification Concerning Availability of the Publication Serial No. PCT/US2012/024122 dated Aug. 16, 2012.
Korean Office Action for Application Serial No. KR 30-2010-0047049 dated Sep. 12, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394 dated Nov. 27, 2012.
Supplemental Notice of Allowance for U.S. Appl. No. 29/382,394 dated Jan. 14, 2013.

* cited by examiner

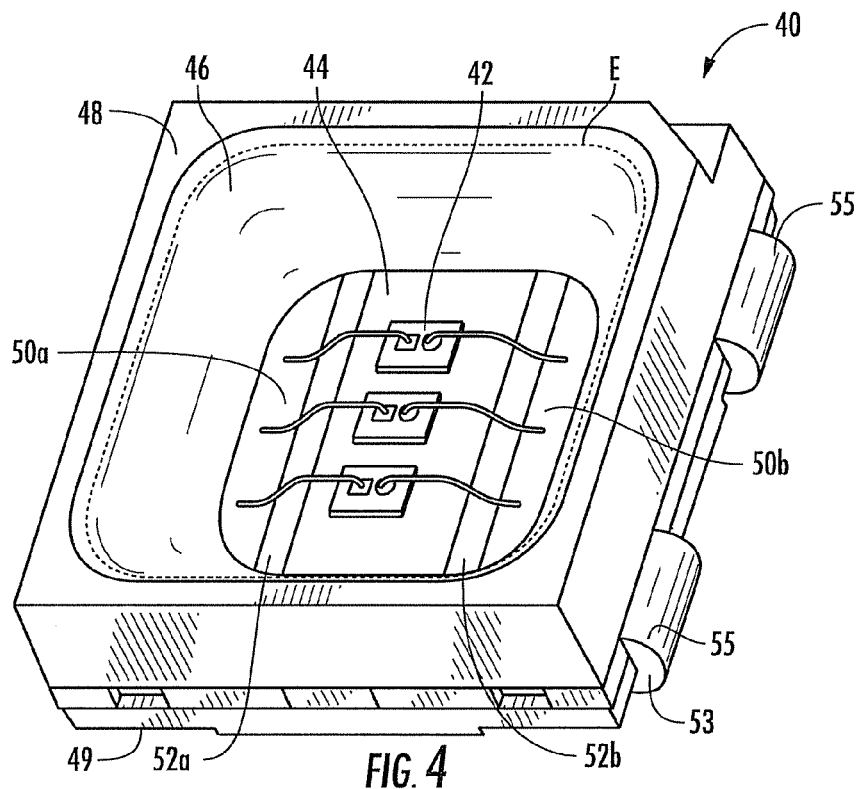
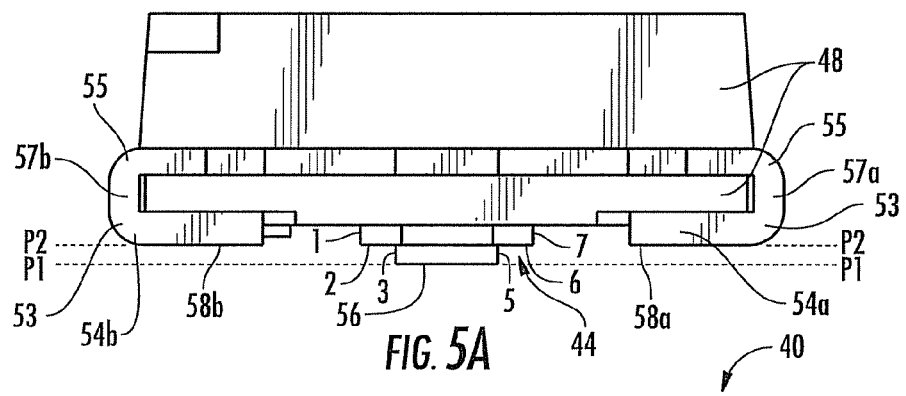
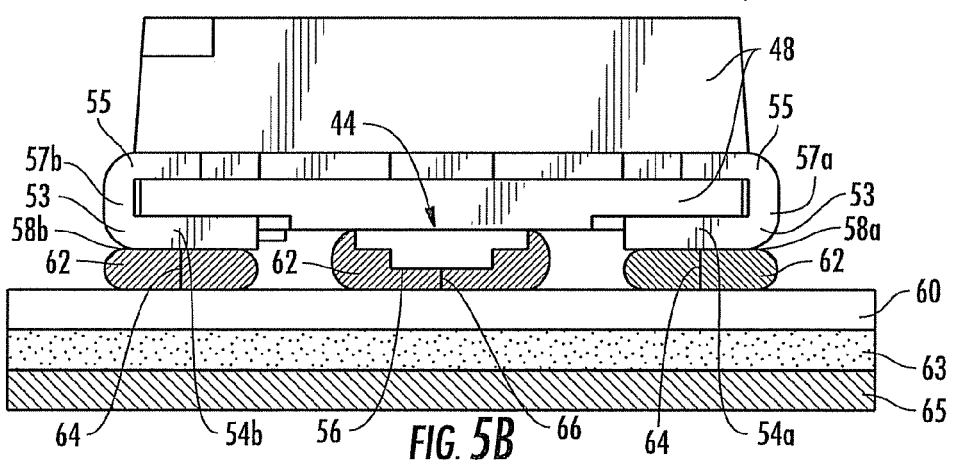

LIGHT EMITTING DEVICE PACKAGES WITH IMPROVED HEAT TRANSFER

CROSS REFERENCE TO RELATED APPLICATIONS

This application relates and claims priority to and is a continuation-in-part application from these related matters: co-pending U.S. utility patent application Ser. No. 12/479,318, filed Jun. 5, 2009; U.S. design patent application Ser. No. 29/330,657, filed Jan. 12, 2010; U.S. design patent application Ser. No. 29/353,652 filed Jan. 12, 2010; U.S. design patent application Ser. No. 29/338,186 filed Jun. 5, 2009, and U.S. design patent application Ser. No. 29/360,791 filed Apr. 30, 2010, the entire contents of all of which are hereby incorporated by reference herein.

TECHNICAL FIELD

The subject matter disclosed herein relates generally to packages for light emitting devices. More particularly, the subject matter disclosed herein relates to light emitting device packages with improved heat transfer.

BACKGROUND

Light emitting devices, such as light emitting diodes (LEDs) for example, are often packaged within surface mounted device (SMD) housings. These housings are often made of plastic and are referred to as plastic leaded chip carriers (PLCCs). SMD housings can typically feature an LED connected to multiple metal leads. Portions of the leads may be molded within a plastic body, while other portions may protrude and extend outside of the plastic body. The molded plastic body can define a reflector for enhanced light emission and can be coated with an encapsulant containing a phosphor, such as yttrium aluminum garnet (YAG) for obtaining light having a desired wavelength spectrum. The body of the SMD housing can also comprise a ceramic material. The metal leads of the leadframe package serve to as a channel for supplying the LED with electrical power and, at the same time, may act to draw heat away from the LED chip.

Heat is generated by the LED when power is applied to the LED to produce light. The portion of the leads that can extend out from the package body can connect to circuits external to the leadframe package, for example those on a printed circuit board (PCB). Some of the heat generated by the LED may be dissipated by the plastic package body; however, it is desirable for most of the heat to be drawn away from the LED via the metal components, or other elements of high thermal conductivity. To increase the heat dissipating capacity of an LED package, a heat transfer material or substrate such as a heat slug may be introduced into the package. Standard soldering processes such as lead-free reflow are used for assembly of the LED packages to external sources, such as PCBs. Once soldered, the heat slug can draw heat from the LED chip to an external source, thus increasing the heat dissipating capacity of the LED package. However, conventional package designs utilize designs wherein the external surface of the heat slug is flush with an external surface of the metal leads on a side of the package in which the surfaces will become attached to the PCB. To be adequate, the metal leads need only establish an electrical contact with the PCB. However, adequate contact between the PCB and heat sink is more difficult because in order to ensure adequate thermal transfer, ideally the entire bottom surface of the heat sink needs wetted by the solder to minimize voids. Current LED package designs can result in the surface of the heat sink being inadequately wetted, thus inadequately soldered to the PCB and thereby decreasing both reliability and heat dissipation of the LED package. If not adequately wetted, voids can exist between the bottom surface of the heat transfer material and the PCB, thus resulting in poor heat transfer as well as heat dissipation problems.

Consequently, there remains a need for improved light emitting device packages that overcome or alleviate shortcomings of prior art light emitting device packages.

SUMMARY

In accordance with this disclosure, light emitting device packages are provided with improved heat transfer. It is, therefore, an object of the present disclosure herein to provide light emitting device packages with both improved solder reliability and improved heat dissipating capacity for improving heat transfer between a backside of the LED package and a printed circuit board (PCB) or other receiving substrate.

These and other objects of the present disclosure as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIG. 4 illustrates a perspective top view of an embodiment of an LED package with a heat transfer material according to the subject matter herein;

FIG. 5A illustrates a side view of an embodiment of an LED package with a heat transfer material according to FIG. 4;

FIG. 5B illustrates a side view of an embodiment of a mounted LED package according to the subject matter herein;

DETAILED DESCRIPTION

Figure 1:
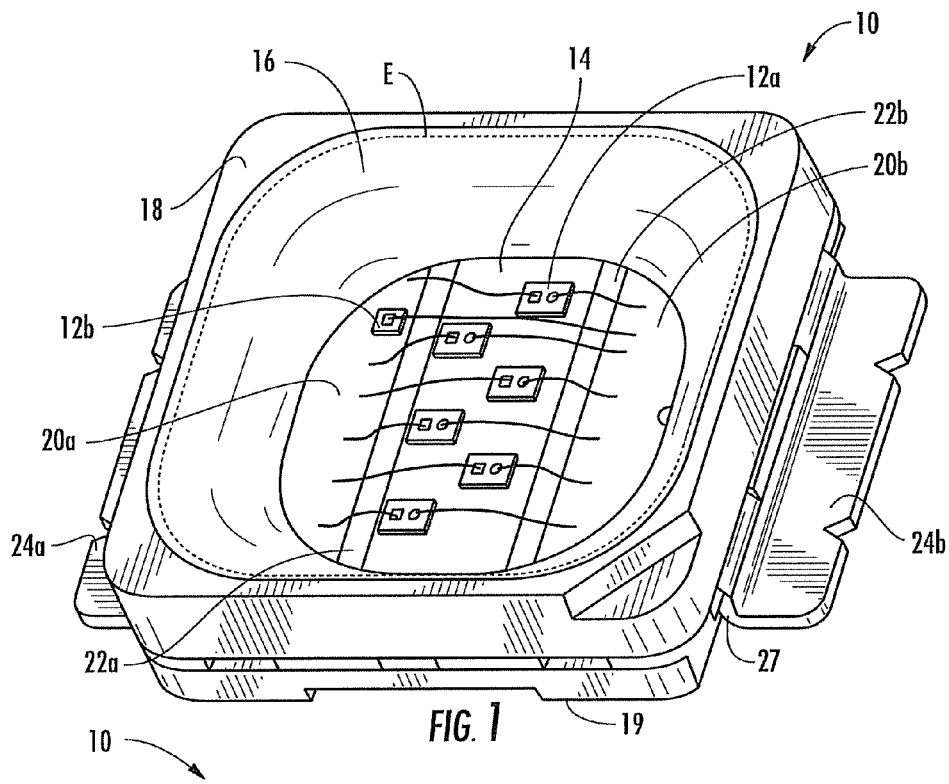
FIG. 1 illustrates a perspective top view of an embodiment of an LED package with a heat transfer material according to the subject matter herein.

Reference will now be made in detail to possible embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise III-V nitride (e.g., gallium nitride) based light emitting diodes (LEDs) or lasers fabricated on a silicon carbide substrate, such as those devices manufactured and sold by Cree, Inc. of Durham, N.C. Such LEDs and/or lasers may also be configured to operate such that light emission occurs through the substrate in a so-called "flip chip" orientation or by conventional wirebonding techniques.

Referring now to FIGS. 1-10F, FIG. 1 illustrates a top perspective view of one embodiment of a light emitting device package, for example an LED package, generally designated 10. Corresponding side and bottom perspective views of LED package 10 are illustrated in FIGS. 2A-2C and 3A-3B. FIGS. 2B-2C illustrate LED package 10 engaging an external source or substrate, for example a printed circuit board (PCB) 30. LED package 10 can comprise a body 18 housing one or more LED chips 12a attached to an upper surface of a thermal element. An electrostatic discharge (ESD) protection device 12b can be part of the LED package 10 and mounted to a top surface of an electrical element, for example a metal lead 20a. For example, ESD protection device 12b can comprise a Zener diode, ceramic capacitor, transient voltage suppression (TVS) diode, multilayer varistor, a Shottky diode and/or any other ESD device known in the art.

Body 18 can comprise a body selected from a group of materials consisting of molded plastic, polymeric, thermoset plastic, thermoplastic, ceramic, nylon, liquid crystal polymer (LCP), or polyvinyl chloride (PVC) wherein body 18 can be disposed around thermal and electrical elements. The thermal element can comprise a heat transfer material or substrate 14, such as for example a heat slug disposed on a bottom floor of a reflector cavity 16 of the package body 18, and reflector cavity 16 can be coated with an encapsulant E. Encapsulant E can comprise any suitable material known in the art and can optionally comprise a phosphor or a lumiphor to interact with light emitted by the LED chips 12a and responsively emit light of a different wavelength spectrum. For illustration purposes, encapsulant E is shown to fill reflector cavity 16 essentially flush with an upper surface of the body. Encapsulant E however, may be filled to any suitable level within the reflector cavity 16 or even exceed and extend above reflector cavity 16 as known in the art.

Figure 3A:
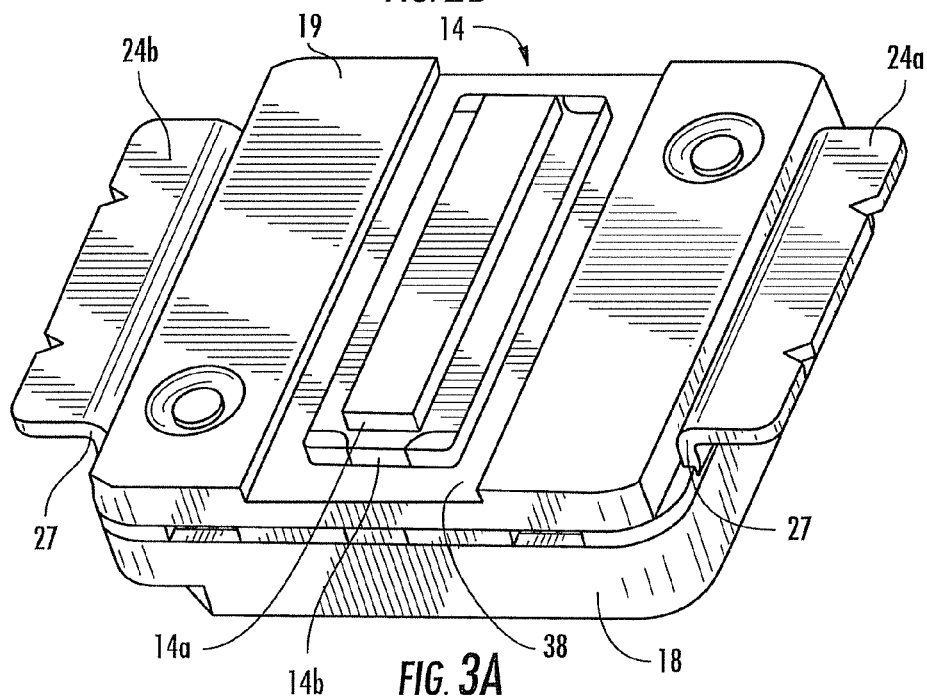
FIG. 3A illustrates a perspective bottom view of an embodiment of an LED package with a heat transfer material according to the subject matter herein.
Figure 3B:
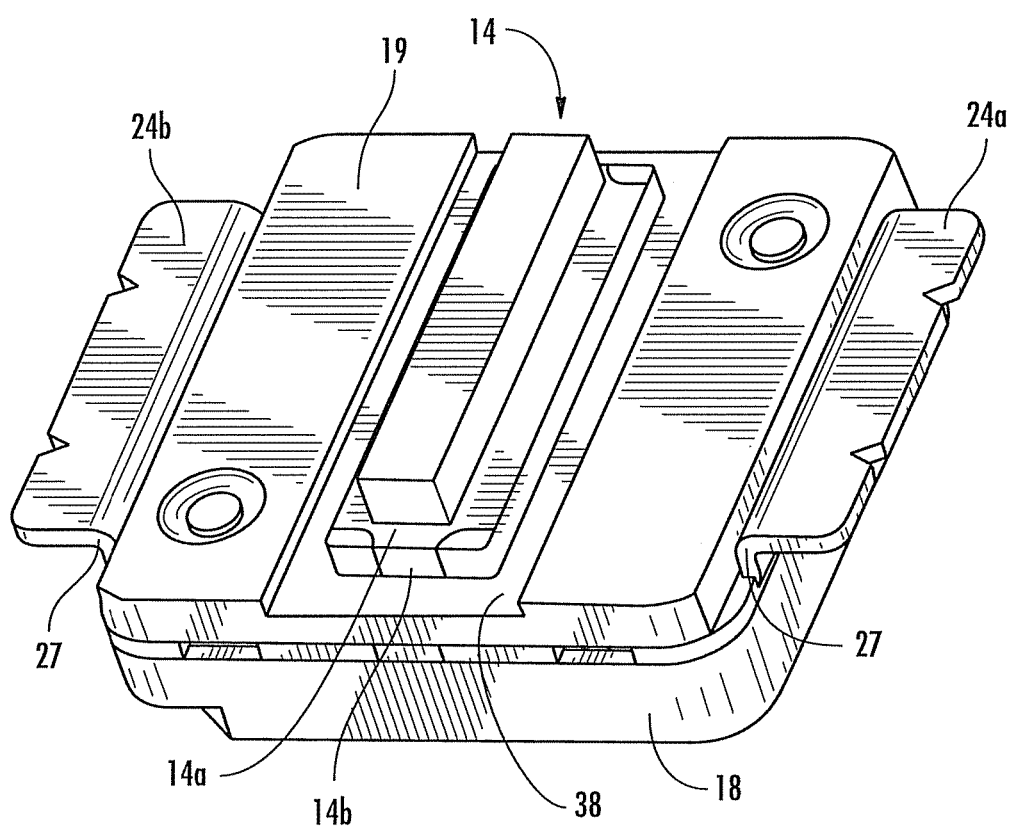
FIG. 3B illustrates a perspective bottom view of an embodiment of an LED package with a heat transfer material according to the subject matter herein.

The thermal element can comprise a thermal heat transfer material 14, and can comprise a metal or any other suitable thermally conducting material known in the art. Heat transfer material 14 can be formed integrally as one piece or, as illustrated in FIGS. 3A and 3B, may comprise several portions, for example a protruding portion 14a attached to and extending from a base portion 14b of thermally conducting material assembled together as known in the art. Heat transfer material 14 as well as all the other heat transfer materials identified and described further herein can be any suitable type of heat transfer device. In one aspect, heat transfer material 14 as well as all the other heat transfer materials identified and described further herein can be an intermediary thermal structure for transferring heat to another structure such as a heat transfer layer or a heat sink for further heat dissipation. In this aspect, heat transfer material 14 as well as all the other heat transfer materials identified and described further herein can be a thermal structure with limited heat capacity and capable of heating up quite quickly if not effectively connected thermally to a further heat transfer device such as an actual heat sink.

Wirebonding the LED chips 12a and ESD device 12b can electrically connect the LED chips 12a and ESD device 12b to electrical elements. Heat transfer material 14 can be electrically isolated from electrical elements 22a and 22b, for example isolated from metal leads 20a and 20b, by insulating portions of body 18. An exposed lower surface 26 of heat transfer material 14 can extend from a bottom surface 19 of body 18. Heat transfer material 14 can conduct heat away from LED chips 12a and LED package 10 allowing improved heat dissipation therefrom.

Figure 2A:
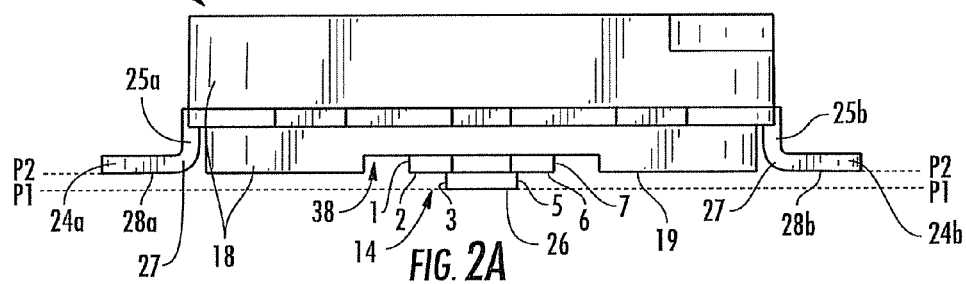
FIG. 2A illustrates a side view of an embodiment of an LED package with a heat transfer material according to FIG. 1.
Figure 2B:
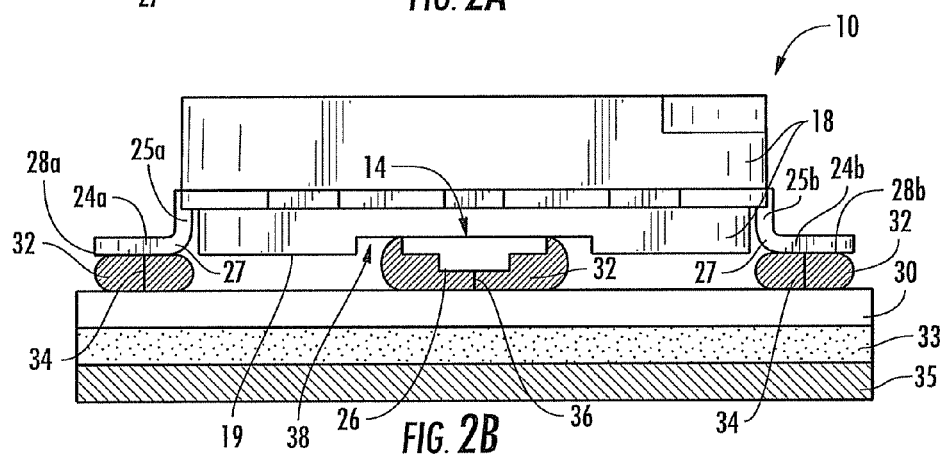
FIG. 2B illustrates a side view of an embodiment of a mounted LED package according to the subject matter herein.
Figure 2C:
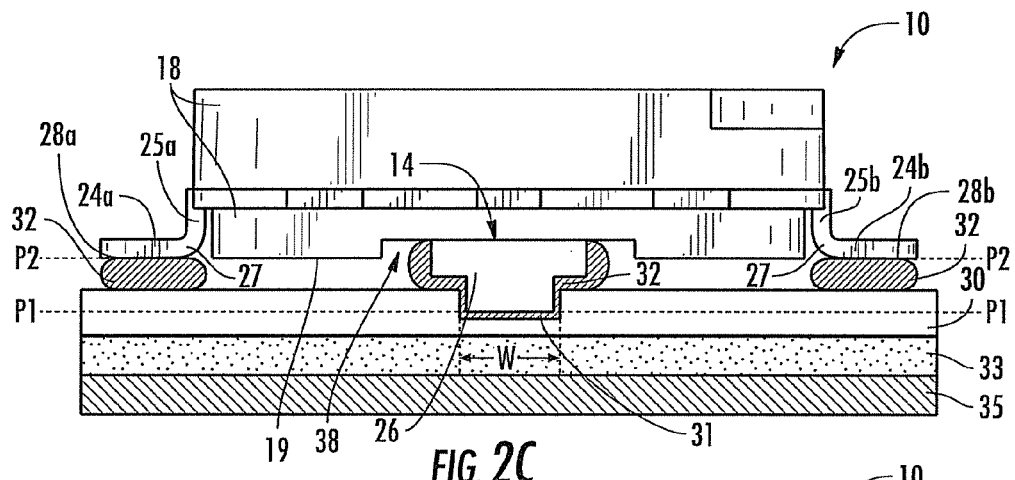
FIG. 2C illustrates a side view of an embodiment of a mounted LED package according to the subject matter herein.

Electrical elements can comprise metal leads 20a and 20b formed from a leadframe which can serve as anode and cathode connections supplying the LED chips 12a with current sufficient to cause light emission. Leads 20a and 20b can comprise a metal or any other suitable electrically conducting material known in the art. Vertical portions 25a and 25b of leads 20a and 20b, respectively, can extend from body 18 at lateral exterior side walls of body 18. Vertical portions 25a and 25b can extend vertically in a downward direction from body 18 and can also comprise a portion orthogonal to linear portions 24a and 24b of leads 20a and 20b. Linear portions 24a and 24b can extend outwards in a linear direction and in opposite directions away from the body 18 of the LED package 10. Vertical portions 25a and 25b can be located along exterior sides disposed between an upper surface of the body 18 having the reflector cavity 16 and a bottom surface 19 of the body 18. Vertical portions 25a and 25b and linear portions 24a and 24b can each comprise a bend such as bend 27 disposed therebetween. That is, each bend 27 provides a transitioning area wherein vertical portions 25a and 25b transition perpendicularly into linear portions 24a and 24b, respectively. This arrangement of lead components can be referred to as a "gull wing" type lead component. Each bend 27 can be formed before or more typically after formation of body 18 structure. Linear portions 24a and 24b can be electrically connected to form an electrical contacts with an external source, such as for example, a PCB 30 as illustrated by FIGS. 2B and 2C. The gull wing type lead component can be difficult to manufacture, as the body of the package is prone to damage when the package is subjected to bending forces required to induce the linear portions of the leads to bend out away from the body 18 and each other.

Referring now to FIG. 2B, linear portions 24a and 24b of leads 20a and 20b, as well as a bottom surface 26 of heat transfer material 14 can be mounted to the PCB 30 using standard soldering techniques wherein solder 32 wets bottom surfaces of both the thermal and electrical elements. Such techniques can comprise for example, soldering PCB 30 in a reflow oven or placing PCB 30 on a hotplate. Any suitable solder material known in the art and capable of securing thermal and electrical elements, that is heat transfer material 14 and linear portions 24a and 24b of leads 20a and 20b, to PCB 30 may be used. For example, a solder 32 can comprise a solder paste of gold, tin, silver, lead and/or copper (Au, Sn, Ag, Pb, and/or Cu), reflow solder flux, and/or any combination thereof. For example, Sn 96.5/Ag 3.0/Cu 0.5 is a common Pb-free solder as is Sn 95.5/Ag 3.8/Cu 0.7.

As further illustrated by FIGS. 2A-2D, heat transfer material, generally designated 14, can comprise bottom surface 26 which extends further away from the body 18 at a greater distance than a distance from the body 18 to bottom surfaces 28a and 28b of linear portions 24a and 24b, respectively, of leads 20a and 20b when package 10 is mounted, for example by soldering, to the PCB 30. Thus, bottom surface 26 of heat transfer material 14 can be said to be extending a distance to a first plane P1 which is lower than a second plane P2 which is the plane of the bottom surfaces 28a and 28b of linear portions 24a and 24b of leads 20a and 20b. As shown by FIGS. 2A-2D, the bottom surfaces 28a and 28b of the electrical element extend away from the body a first distance, and the bottom surface 26 of the thermal element extending away from the body a second distance, and the second distance can be greater than the first distance. In one aspect, a suitable distance between P1 to P2 can, for example only and without limitation, be from slightly above 0 μm to greater than 100 μm. In other embodiments, the distance from P1 to P2 can be from 25 μm to 50 μm, 50 μm to 100 μm, or greater than 100 μm.

As illustrated by FIG. 2B, once wetted by solder 32, any gap between the thermal element, that is, a gap 36 between bottom surface 26 of heat transfer material 14 and the PCB 30 will be smaller than a gap 34 between the electrical elements, that is, the bottom surfaces 28a and 28b of linear portions 24a and 24b of leads 20a and 20b and PCB 30. Having heat transfer material 14 in this configuration can increase the likelihood that the solder 32 will wet the entire bottom surface 26 of heat transfer material 14 and can allow formation of an adequate thermal contact between the LED package 10 and PCB 30. Upon solidification of the solder 32, the thermal contact between heat transfer material 14 and PCB 30 can comprise a solder joint that is essentially free of voids, thereby being more reliable. This can increase the likelihood of obtaining better heat transfer from heat transfer material 14 to PCB 30. For example, if LED package 10 were to be sheared from PCB 30, a footprint of the solder joint on the backside of the package and PCB 30 would preferably be essentially free of voids. A small number, or substantially zero voids indicates better wetting of the thermal element, and a better, more reliable thermal contact between heat transfer material 14 of LED package 10 and PCB 30. Bottom surface 26 of heat transfer material 14 as well as bottom surfaces 28a and 28b of portions of leads 24a and 24b are thus all wetted by solder 32 and connected to the PCB 30 upon solidification of the solder 32.

Figure 2D:
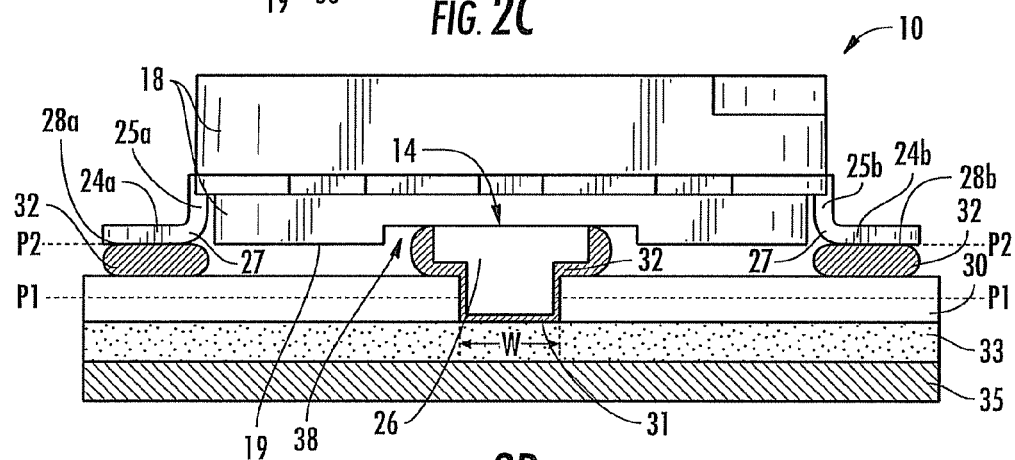
FIG. 2D illustrates a side view of an embodiment of a mounted LED package according to the subject matter herein.

Also illustrated by FIGS. 2B-2D, PCB 30 can be an intermediate substrate located above a heat transfer layer 33 and a heat sink 35. Heat can dissipate away from LED package 10 by moving in a path and pass from the heat transfer material 14 into solder 32 and then into the PCB 30. Heat can then pass from PCB 30 and into heat transfer layer 33 which can comprise any material known in the art that is thermally conductive. Heat continues on a path which passes from heat transfer layer 33 into heat sink 35 which can pass heat into ambient air for example. Heat sink 35 can comprise any material known in the art capable of conducting heat, and which ideally would not increase in temperature when heat is applied.

FIGS. 2A-2D also illustrate bottom surface 26 of heat transfer material 14 which can be disposed in a recess 38 that can be formed in or part of the bottom surface 19 of body 18.

Recess 38 can allow the overflow of solder (such as solder 32) and/or flux to move into recess 38. This feature can eliminate or reduce the need to clean residue left behind by the attachment process, for example, using a "no-clean" solder. Recess 38 can also allow more access for solvents to remove flux after the reflow process if using for example, a "clean" solder which must undergo a cleaning process. Because of process variability, the amount of solder and/or flux that is dispersed to connect components, such as heat transfer material 14 and PCB 30, can vary significantly. As the solder and/or flux can be very difficult to remove from substrates such as PCBs, recess 38 provides a space for any excess solder and/or flux to flow into thereby producing the area(s) needing cleaning afterwards. Exposed portions of heat transfer material 14 can be located within recess 38. For example, FIG. 2A shows exposed portions 1-3, 26, and 5-7 of heat transfer material 14. Each exposed portion is an external surface of heat transfer material 14, which can be formed integrally as one piece, or formed from more than one portion such as protruding portion 14a and base portion 14b illustrated in FIGS. 3A-3B. As illustrated, at least one of the exposed portions 1-3, 26, and 5-7 of heat transfer material 14 can be located above the bottom surface 28a and 28b of linear portions 24a and 24b of leads, that is located above P2 while at least one of the exposed portions 1-3, 26, and 5-7 can be located below P2.

More specifically, in high-temperature metal joining processes including soldering, flux can have a primary purpose of preventing oxidation of the base and filler materials. Flux is a substance which is nearly inert at room temperature, but which becomes strongly reducing at elevated temperatures, thus preventing the formation of metal oxides. Flux also acts as a wetting agent in the soldering process, reducing surface tension of the molten solder and causing it to better wet the components being joined. Fluxes can comprise water-soluble fluxes so-called "clean" fluxes that do not require any volatile organic compounds for removal and "no-clean" fluxes which are mild enough to not require removal at all. Some fluxes are formulated to result in a residue which is not significantly corrosive, but cleaning is still preferred. As such, it is advantageous that recess 38 provides a space for any excess solder and/or flux to flow into thereby producing the areas needing cleaning afterwards.

Referring to FIGS. 2C and 2D, PCB 30 can optionally comprise a notch 31 that can extend either partially (FIG. 2C) or entirely through (FIG. 2D) PCB 30. Notch 31 can facilitate for example, the alignment of heat transfer material 14 or any other heat transfer materials when mounting to a thermally conductive element of an external substrate, such as a PCB 30. Other features correspond to FIGS. 2A and 2B described above. At least a portion of heat transfer material 14 can extend into and at least partially or completely fill notch 31. That is, bottom surface 26 of heat transfer material 14 can substantially correspond to a surface of notch 31 and sides of at least a portion of heat transfer material 14 can be smaller than or substantially correspond in width to a width W of notch 31. Solder 32 can still flow around heat transfer material 14 to connect heat transfer material 14 to PCB 30. Plane P1 of heat transfer material 14 can extend from P2 a distance required to fill notch 31. For example, the distance can be from slightly above 0 μm to 100 μm, from 25 μm to 50 μm, or greater than 100 μm. As illustrated by FIG. 2D, notch 31 can extend and comprise a depth entirely through PCB 30 wherein heat transfer material 14 can thermally contact and connect any suitable further heat dissipating structure or structures, such as heat transfer layer 33. This can further improve heat dissipation from the LED package 10. For example, heat transfer material 14 can have at least a portion of bottom surface 26 soldered directly to heat transfer layer 33 while at least a portion of exposed portions 1-3 and 5-7 (FIG. 2A) of heat transfer material 14 can be soldered to PCB 30. In FIGS. 2C and 2D, heat can advantageously pass away from the LED package 10 and into intermediate components comprising heat transfer material 14, PCB 30, and heat transfer layer 33 before ultimately passing into heat sink 35. Alternatively, heat transfer material 14 can thermally contact and connect with heat sink 35 directly without contacting an intermediate transfer layer such as intermediate heat transfer layer 33.

Referring now to FIGS. 3A and 3B, these figures illustrate a perspective bottom view of the features opposing the top view illustrated by FIG. 1. For example, heat transfer material 14 can be formed integrally as one piece, or may be formed from several portions including protruding portion 14a and base portion 14b. Base portion 14b of the thermal element extends from body 18. Protruding portion 14a attaches to base portion 14b and can be dimensionally smaller on the sides than base portion 14b although it can be of a greater height or thickness than base portion 14b as illustrated by FIG. 3B. Protruding portion 14a and base portion 14b can comprise any size and/or shape known in the art and are not limited hereto. Having a protruding portion 14a from a base portion 14b allows improved wetting as solder can more fully wet the surface of protruding portion 14a. Thus, a more uniform solder joint, or thermal connection, can form between the LED package 10 and PCB 30. Heat transfer material 14 can be disposed within recess 38 and linear portions 24a and 24b of electrical elements can be seen extending outwards from the body in a direction away from each other. FIG. 3A illustrates a view wherein the distance between planes P1 and P2 can be as illustrated by FIG. 2A and can, for example only and without limitation, range from slightly above 0 μm to 50 μm, 25 μm to 50 μm, or 50 μm to 100 μm. FIG. 3B illustrates a larger heat transfer material wherein the distance between planes P1 and P2 is greater and can be greater than 100 μm, and could be useful for applications as illustrated by FIGS. 2C and 2D. For applications utilizing distances greater than about 100 μm, notch 31 can be useful for alignment purposes and to facilitate adequate contact between the thermal element, heat transfer material 14, and the PCB 30.

FIGS. 4-6C illustrate views of another embodiment of an LED package, generally designated as 40, having features which can correspond substantially in form and function to those of FIGS. 1-3B. For example, LED package 40 can comprise one or more LED chips 42 attached to an upper surface of a thermal element. One or more ESD devices (not shown) may be attached to an upper surface of an electrical element as well. Thermal element can comprise a heat transfer material generally designated 44 made of a thermally conducting material and disposed on a bottom floor of a reflector cavity 46 of a package body 48. As previously described, body 48 can comprise any suitable material known in the art, and can be formed about, thereby encasing thermal and electrical elements. Reflector cavity 46 can be coated with encapsulant E which can optionally containing a phosphor or lumiphor. For illustration purposes encapsulant E is shown as substantially flush with an upper surface of the body 48 and the top of the reflector cavity 46, but it may be filled to any level above or below the top of the reflector cavity 46.

LED chips 42 can electrically connect to electrical elements, for example metal leads 50a and 50b formed from a leadframe which serve as anode and cathode components supplying current to the LED chips 42. Heat transfer material 44 can be electrically isolated from leads 50a and 50b by insulating portions 52a and 52b of the body 48. Heat transfer material 44 can conduct heat away from the LED chips 42 and allow heat to dissipate therefrom. Portions 55 of leads 50a and 50b can extend from the body 48 at a lateral exterior face and transition into linear portions 54a and 54b which can turn in towards each other and face the thermal element when mounted to an external source, for example a PCB 60. Extending portions 55 of leads 50a and 50b can extend from the lateral exterior faces of body 48 and can comprise a first bend. Extending portions 55 can bend to form vertical portions 57a and 57b of leads 50a and 50b which can be orthogonal to linear portions 54a and 54b, respectively. Second bending portions 53 can be located along a central axis beneath extending portions 55 and can perpendicularly transition the vertical portions 57a and 57b into the linear portions 54a and 54b, respectively, of leads 50a and 50b. This configuration can be referred to as a "J-bend" type lead component. Linear portions 54a and 54b form electrical contacts with the PCB 60 upon soldering. Linear portions 54a and 54b can electrically connect to the PCB 60 using standard soldering processes as previously described. As with the gull wing type lead component, the J-bend type lead component can be difficult to manufacture, as the body of the package is prone to damage when the package is subjected to bending forces required to induce the linear portions of the leads to bend in to face each other.

As illustrated in FIGS. 5A-5E, heat transfer material 44 can comprise an exposed, bottom surface 56 which can extend a greater distance away from body 48 of LED package than a distance from body 48 to bottom surfaces 58a and 58b of linear portions of leads 54a and 54b, respectively, when package 40 is mounted, for example by soldering, to the PCB 60. Thus, bottom surface 56 of heat transfer material 44 extends to a lower plane P1 than a plane P2 of which bottom surfaces 58a and 58b can extend to. As shown by FIGS. 5A-5E, the bottom surfaces 58a and 58b of the electrical element extend away from the body a first distance, and the bottom surface 56 of the thermal element can extend away from the body to a second distance. The second distance can be greater than the first distance. A gap 66, which can exist or form between bottom surface 56 of heat transfer material 44 and PCB 60, can be smaller than a gap 64 between the bottom surfaces 58a and 58b of leads 54a and 54b and PCB 60. At least one of exposed portions 1-3, 56, and 5-7 of heat transfer material 44 can be located above the bottom surfaces 58a and 58b of the linear portions 54a and 54b, respectively, of the leads, located above P2. Additionally, at least one of exposed portions 1-3, 56, and 5-7 of heat transfer material 44 can be located below the bottom surfaces 58a and 58b of the linear portions 54a and 54b, respectively, of the leads, located below P2. As described earlier, having heat transfer material 44 in this configuration can increase the likelihood that the entire surface 56 of heat transfer material 44 will be wetted by solder 62, which can allow formation of a good thermal contact between heat transfer material 44 and PCB 60. This configuration can allow LED package 40 to adapt to process variably in the amount of solder dispersed. Once the solder 62 solidifies, the thermal contact can comprise a solder joint that is more reliable because it can be a joint essentially free of voids between LED package 40 and PCB 60. This can ensure improved heat transfer from the bottom surface 56 of heat transfer material 44 to the PCB 60. In addition to bottom surface 56 of heat transfer material 44, bottom surfaces 58a and 58b of linear portions 54a and 54b of the leads can be wetted by solder 62 to form electrical contacts with PCB 60 once solder 62 solidifies.

Figure 5C:
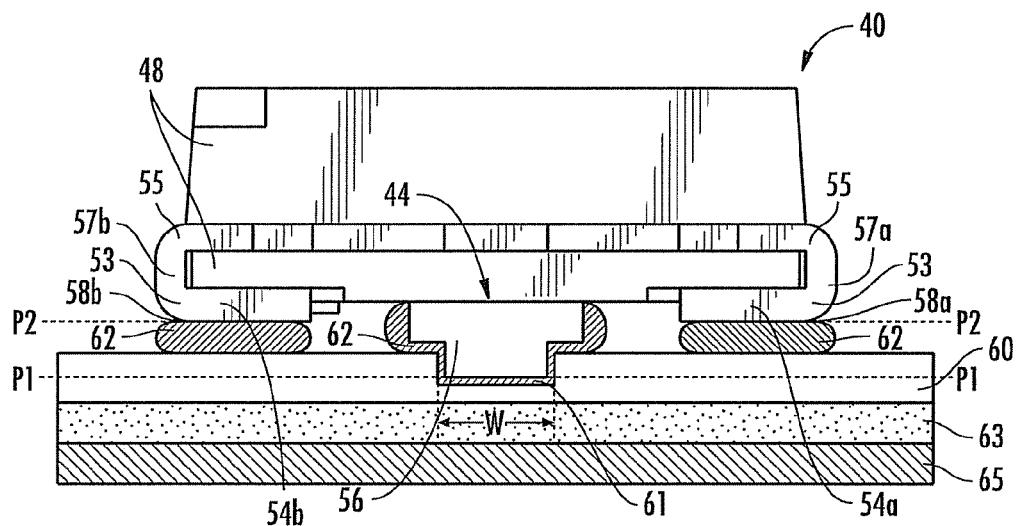
FIG. 5C illustrates a side view of an embodiment of a mounted LED package according to the subject matter herein.
Figure 5D:
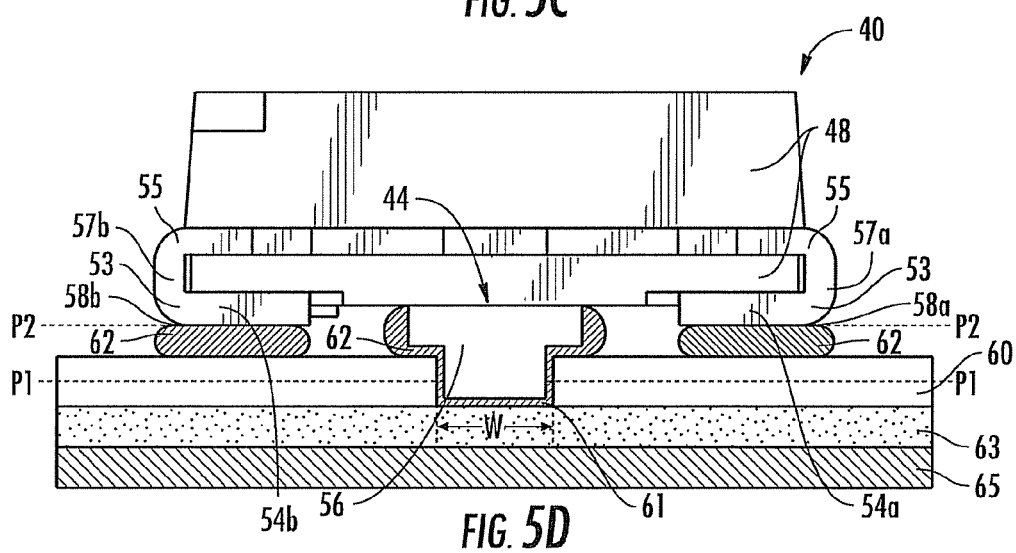
FIG. 5D illustrates a side view of an embodiment of a mounted LED package according to the subject matter herein.

Also illustrated by FIGS. 5B-5D, PCB 60 can comprise an intermediate substrate disposed above a heat transfer layer 63 and a heat sink 65. Heat can dissipate away from the LED package 40 by moving in a path and pass from heat transfer material 44 into solder 62 and then into PCB 60. Heat can then pass from PCB 60 and into heat transfer layer 63 which can comprise any material known in the art that is thermally conductive. Heat continues on a path which passes from heat transfer layer 63 into heat sink 65 which can pass heat into ambient air for example. Heat sink 65 can comprise any material known in the art capable of conducting heat, and which ideally would not increase in temperature when heat is applied.

Referring to FIGS. 5C-5D, PCB 60 can comprise a notch 61 That can extend either partially (FIG. 5C) or entirely (FIG. 5D) through notch 61. Notch 61 can facilitate for example, the alignment of heat transfer material 14 or any other heat transfer materials when mounting to an external substrate, such as a PCB 60. Other features correspond to FIGS. 5A and 5B described earlier. Heat transfer material 44 can be formed integrally in one piece or can comprise more than one portions, for example a protruding portion 44a and a base portion 44b. At least a portion of heat transfer material 44 can extend into notch 61. That is, bottom surface 56 of heat transfer material 44 can substantially correspond to surface of notch 61 and sides of at least a portion of heat transfer material 14 can substantially correspond in width to a width W of notch 61. Solder 62 can still flow around heat transfer material 44 to connect heat transfer material 44 to PCB 60. Plane P1 of heat transfer material 44 can extend from P2 a distance required to substantially engage notch 61, which can, for example and without limitation, be greater than 100 µm. For applications utilizing distances greater than about 100 µm, notch 61 can be useful for alignment purposes and to facilitate adequate contact between the thermal element, heat transfer material 44, and the PCB 60.

Referring to FIG. 5D, notch 61 can extend and comprise a depth entirely through PCB 60 wherein heat transfer material 44 can be connected directly with heat transfer layer 63. This can further improve heat dissipation from the LED package 40. For example, heat transfer material 44 can have bottom surface 56 soldered directly to heat transfer layer 63 while at least a portion of exposed portions 1-3 and 5-7 (FIG. 5A) of heat transfer material 44 can be soldered to PCB 60. In FIGS. 5C and 5D, heat can advantageously pass away from LED package 40 and into intermediate components such as heat transfer material 44, PCB 60, and heat transfer layer 63 before ultimately passing into heat sink 65. Alternatively, heat transfer material 44 can thermally contact and connect with heat sink 65 directly without contacting an intermediate transfer layer such as intermediate heat transfer layer 63.

Figure 5E:
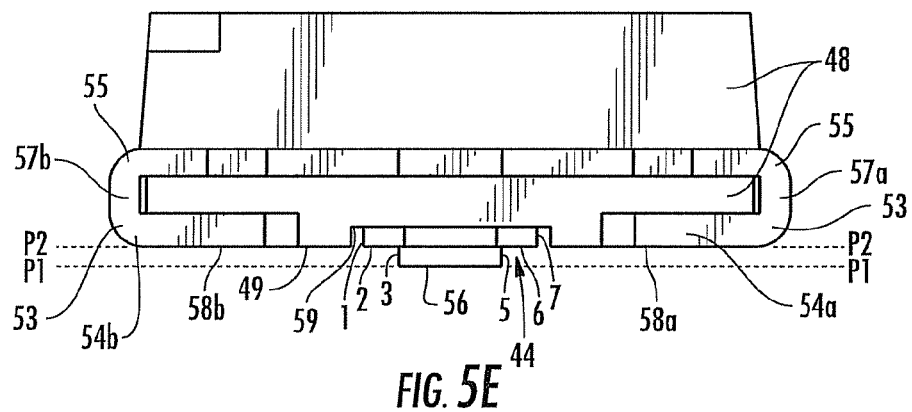
FIG. 5E illustrates a side view of an embodiment of an LED package according to the subject matter herein.

FIG. 5E illustrates bottom surface 56 of heat transfer material 44 which can be disposed in a recess 59 that can be formed in or part of the bottom surface 49 of body 48. Recess 59 can allow the overflow of solder (such as solder 62 in FIGS. 5B and 5C) and/or flux to move into recess 59. This feature can eliminate or reduce the need to clean residue left behind by the attachment process. Because of process variability, the amount of solder and/or flux that is dispersed to connect components, such as heat transfer material 44 and PCB 60, can vary significantly. As the solder and/or flux can be very difficult to remove from substrates such as PCBs, recess 59 provides a space for any excess solder and/or flux to flow into thereby producing the area(s) needing cleaning afterwards. Exposed portions of heat transfer material 44 can be located within recess 59. For example, FIG. 5A shows exposed portions 1-3, 56, and 5-7 of heat transfer material 44. Each exposed portion is an external surface of heat transfer material 44, which can be formed integrally as one piece, or formed from more than one portion such as protruding portion 44a and base portion 44b illustrated in FIGS. 6A-6C. As illustrated, at least one of the exposed portions 1-3, 56, and 5-7 of heat transfer material 44 can be located above the bottom surface 58a and 58b of linear portions 54a and 54b of leads, that is located above P2 while at least one of the exposed portions 1-3, 56, and 5-7 can be located below P2.

Figure 6A:
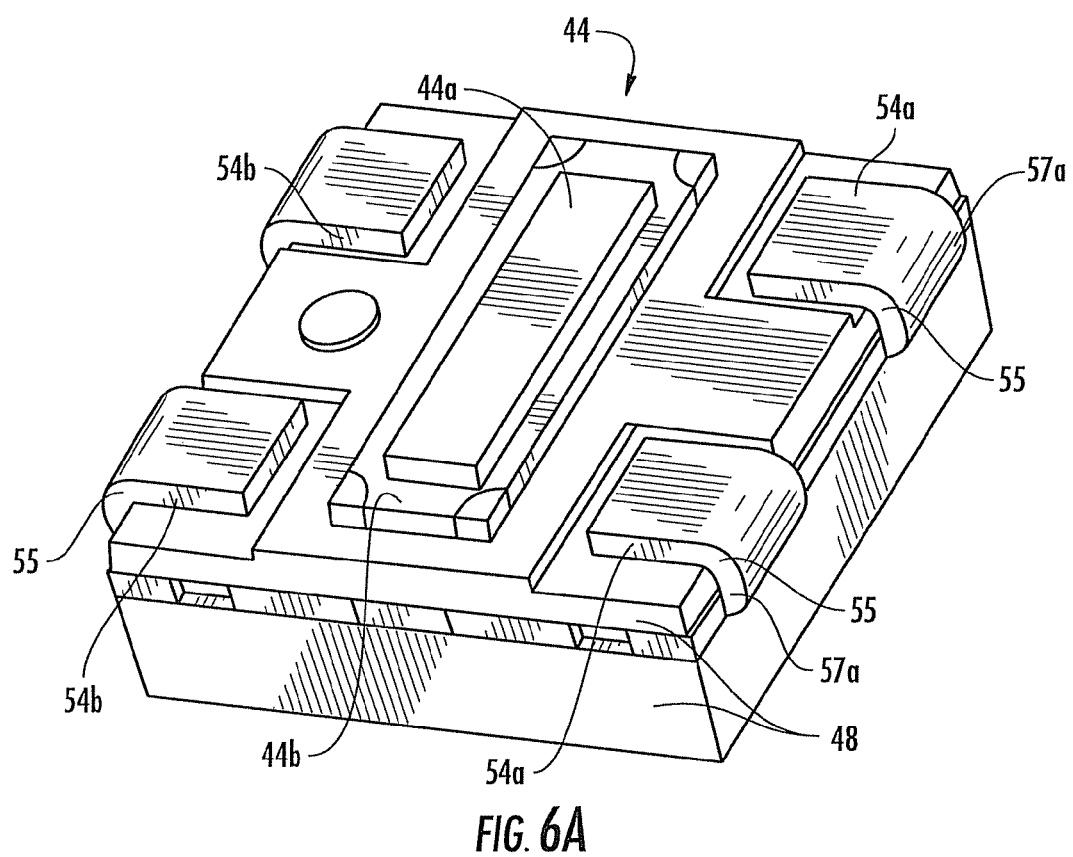
FIG. 6A illustrates a perspective bottom view of an embodiment of an LED package with a heat transfer material according to the subject matter herein.
Figure 6B:
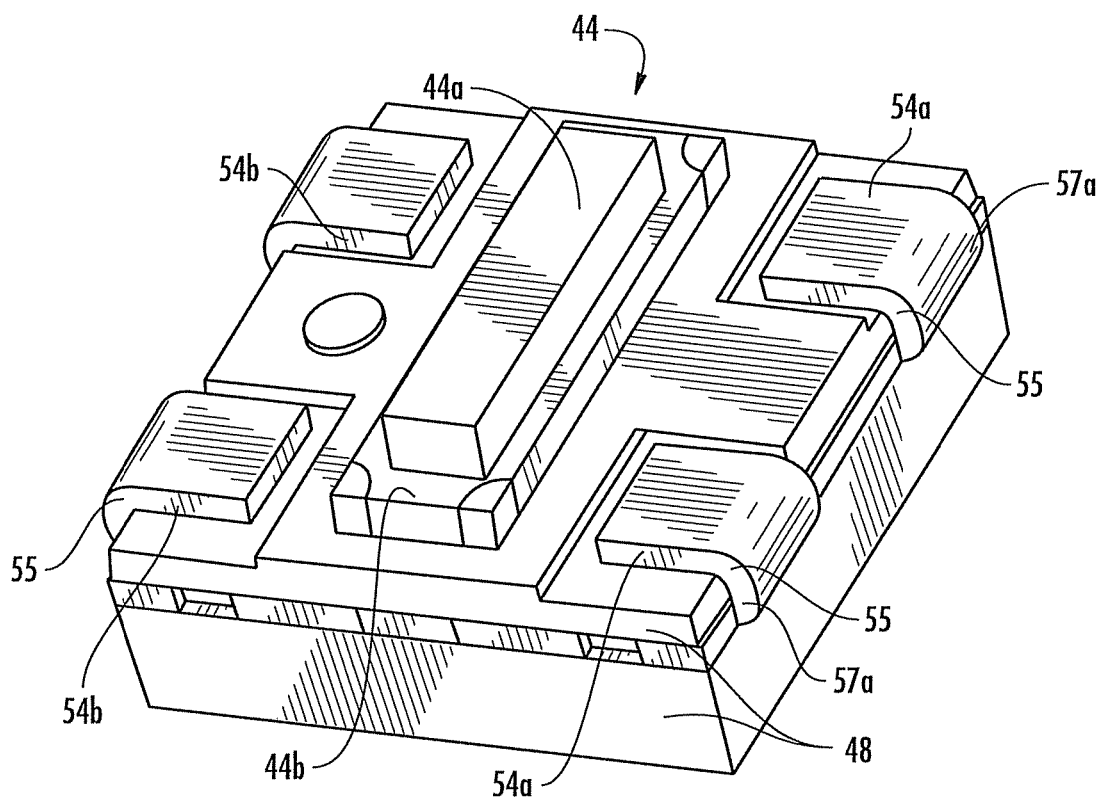
FIG. 6B illustrates a perspective bottom view of an embodiment of an LED package with a heat transfer material according to the subject matter herein.
Figure 6C:
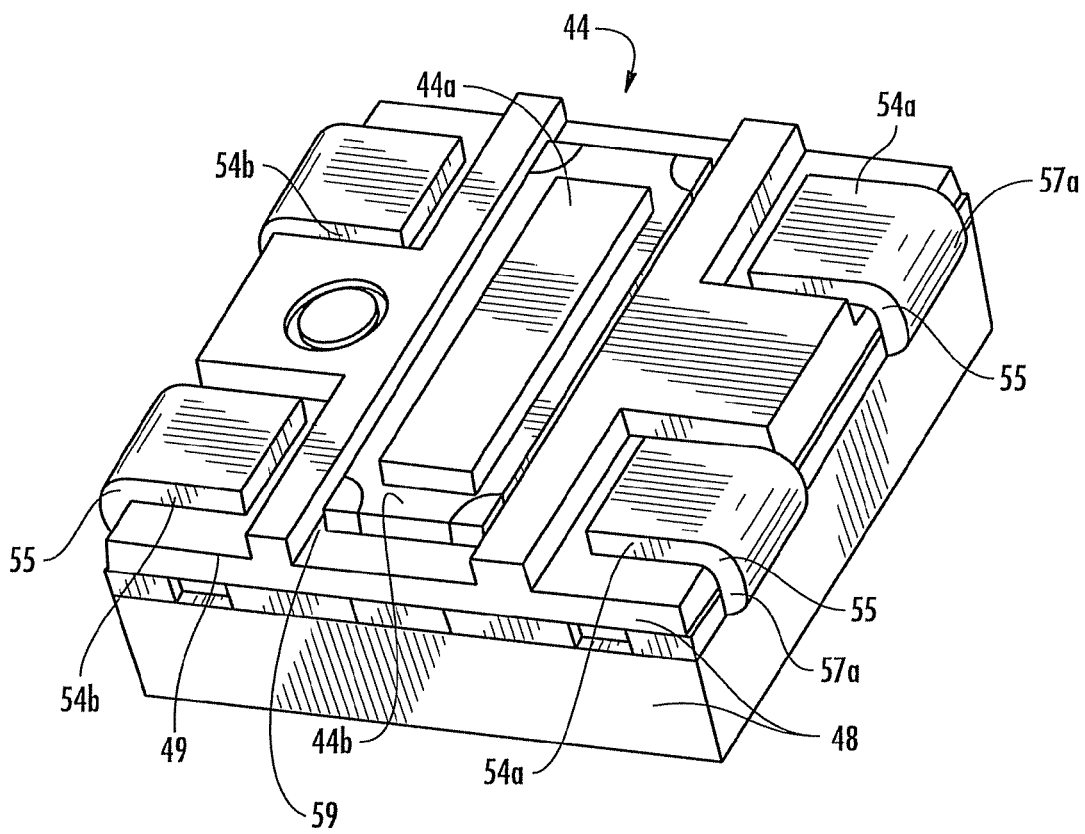
FIG. 6C illustrates a perspective bottom view of an embodiment of an LED package with a heat transfer material according to the subject matter herein.

Referring now to FIGS. 6A-6C, these figures illustrate a perspective bottom view of the features opposing the top view illustrated by FIG. 4. For example, heat transfer material 44 can be formed integrally or by assembling one or more portions together, for example protruding portion 44a and base portion 44b. Linear portions 54a and 54b of electrical elements can be seen as extending in towards the body and towards heat transfer material 44 to face each other. Base portion 44b of the thermal element extends from the body 48. Protruding portion 44a attaches to base portion 44b and can be dimensionally smaller on the sides than base portion 44b although it can be of a greater height or thickness than base portion 44b as illustrated by FIG. 6B. Protruding portion 44a and base portion 44b can comprise any size and/or shape known in the art and are not limited hereto. By having a protruding portion 44a from a base portion 44b, improved wetting can be achieved as solder can more fully wet the surface of the protruding portion 44a. Thus, a more uniform solder joint, or thermal connection, can form between the LED package 40 and PCB 60. FIG. 6A further illustrates a view wherein the distances between planes P1 and P2 (seen in FIG. 5A) is more likely a range between 1 and 50 µm. FIG. 6B illustrates a view wherein the distances between planes P1 and P2 is greater, and more likely greater than 100 µm, and could be useful for applications as illustrated by FIGS. 5C and 5D. FIG. 6C illustrates a view wherein a recess 59 can be formed in or part of the bottom surface 49 of body 48 as seen in FIG. 5E.

FIGS. 7-9B illustrate top perspective, bottom perspective, and side views of another embodiment of an LED package, generally designated 70, which has features that can substantially correspond in form and function to the embodiments shown by FIGS. 1-6C. For example, LED package 70 can comprise one or more LEDs 100a attached to an upper surface of a thermal element and electrically connected to at least one electrical element. One or more ESD devices 100b can also be attached to an upper surface of an electrical element. The thermal element can comprise a heat transfer material 72, and the electrical elements can comprise metal leads 74a and 74b of a leadframe. The thermal and electrical elements can be contained within a molded plastic body 76 having a reflector cavity 76a and can comprise a thickness from an upper surface comprising the LEDs 100a to a bottom surface 76b of the LED package 70. A suitable amount of optically transmitting encapsulant E can fill the reflector cavity to a suitable level within the reflector cavity 76a. Heat transfer material 72 can be electrically isolated from metal leads 74a and 74b by insulating portions 70a and 70b of body 76. Heat transfer material 72 and leads 74a and 74b can extend to at least one exterior lateral side 79a of body 76 wherein the material is sheared resulting in exposed portions which can be flush with the exterior lateral side 79a. For example, heat transfer material 72 can be sheared on the exterior lateral side 79a of body 76 to leave exposed portion 73 flush with the surface of lateral side 79a. Similarly, metal leads 74a and 74b can be sheared flush with the surface of the lateral side 79a, resulting in exposed portions 71a and 71b, respectively, on lateral side 79a. Retention notches 75 can be located on at least a second exterior lateral side 79b of body 76 adjacent first lateral side 79a having the sheared, exposed portions 73, 71a, and 71b. Retention notches 75 can improve handling of LED package 70 during processing.

Figure 7:
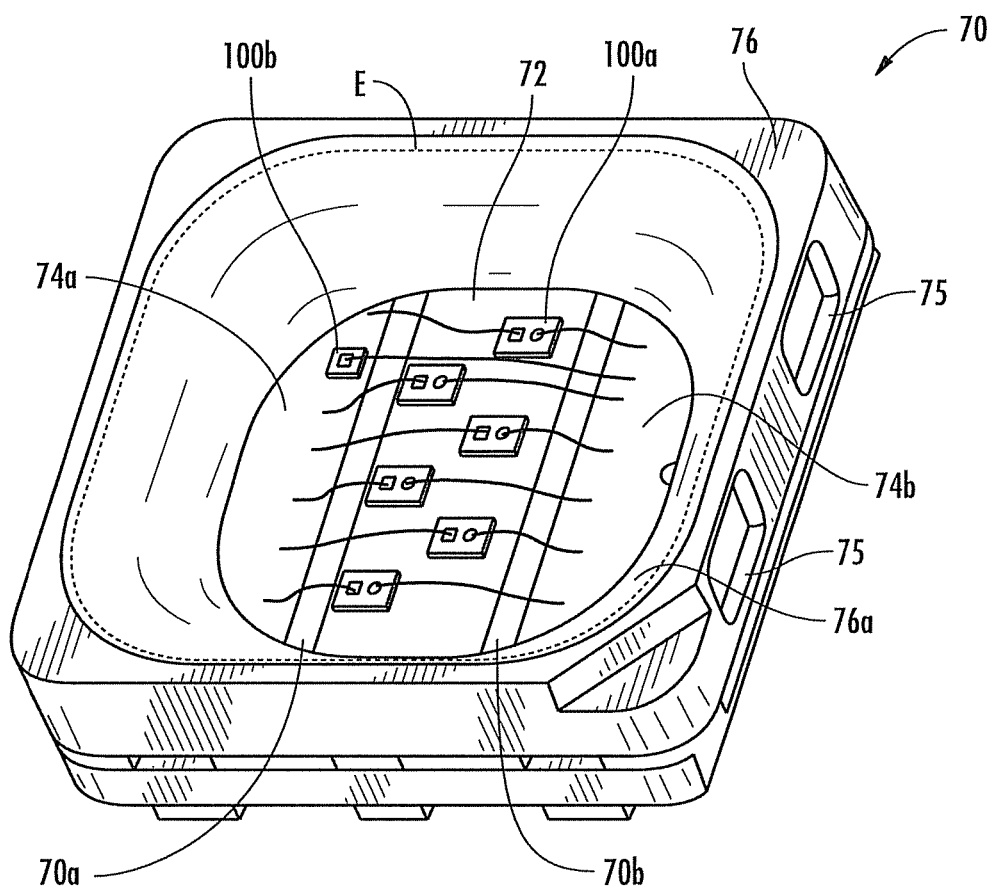
FIG. 7 illustrates a perspective top view of an embodiment of an LED package with a heat transfer material according to the subject matter herein.
Figure 8:
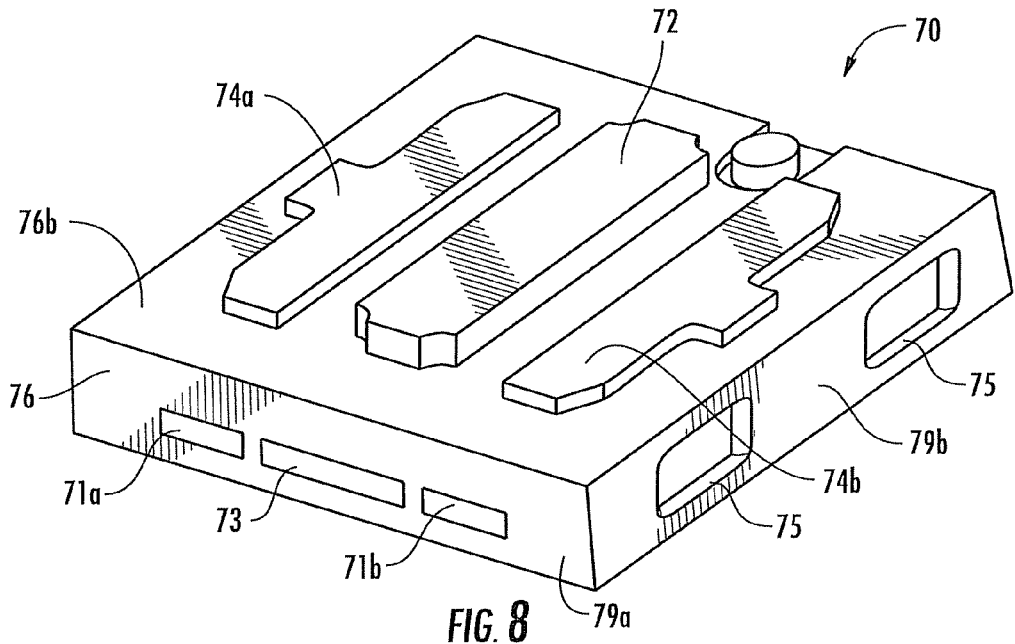
FIG. 8 illustrates a perspective bottom view of an embodiment of an LED package with a heat transfer material according to FIG. 7.
Figure 9A:
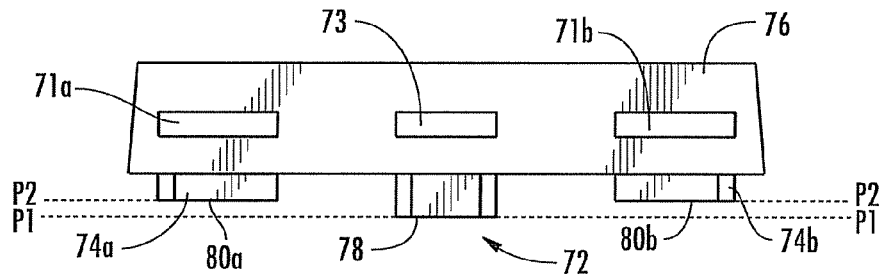
FIG. 9A illustrates a side view of an embodiment of an LED package with a heat transfer material according to FIG. 7.
Figure 9B:
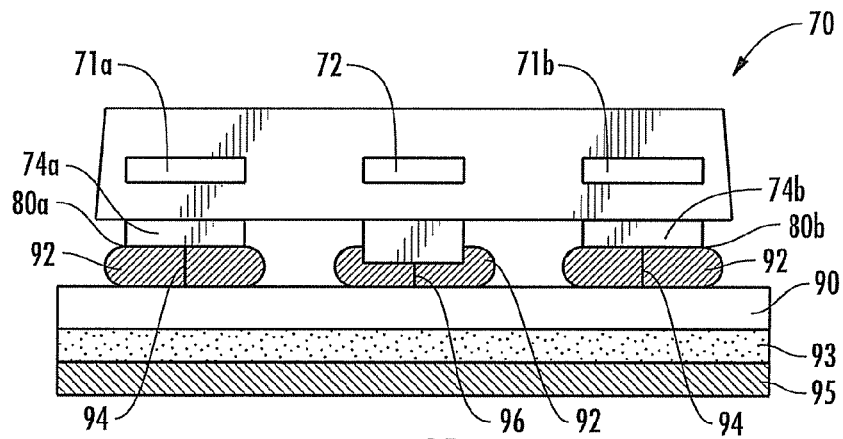
FIG. 9B illustrates a side view of an embodiment of a mounted LED package according to the subject matter herein.

FIG. 8 illustrates the bottom perspective view of the features illustrated by FIG. 7. In this embodiment, leads 74a and 74b extend from bottom surface 76b which is substantially orthogonal to exterior lateral sides 79a and 79b of the LED package 70. That is, leads 74a and 74b do not comprise portions which extend beyond any lateral exterior side or any lateral exterior surface of LED package 70. As illustrated in FIGS. 9A and 9B, heat transfer material 72 can comprise a bottom surface 78 which can extend to a greater distance away from body 76 of LED package 70 than a distance from body 76 to bottom surfaces 80a and 80b of leads 74a and 74b, respectively, when package 70 is mounted to a PCB 90. That is, heat transfer material 72 can extend to have its bottom surface 78 located on a plane P1 which is lower than a plane P2 of the bottom surfaces 80a and 80b of leads 74a and 74b, respectively. In one embodiment, a suitable range in distance between P1 and P2 can be from slightly above 0 µm to greater than 100 µm. In other embodiments, a suitable range in distance between P1 and P2 can be from about 25 µm to 50 µm, 50 µm to 100 µm, or greater than 100 µm. When package 70 is mounted, for example by soldering, to a PCB 90, a gap 96 can exist between the bottom surface 78 of heat transfer material 72 and PCB 90 which can be smaller than a gap 94 existing between bottom surfaces 80a and 80b of leads 74a and 74b and the PCB 90. A more uniform and reliable thermal contact, or solder joint created between heat transfer material 72 and PCB 90, can form once solder 92 solidifies such that the thermal contact is essentially free of voids. As such, overall heat transfer, heat dissipation capability, and thermal properties of LED package 70 are improved. In addition to bottom surface 78, bottom surfaces 80a and 80b of leads 74a and 74b can also be wetted by solder 92 to form electrical contacts with PCB 90.

Also illustrated by FIG. 9B, PCB 90 can comprise an intermediate substrate disposed above a heat transfer layer 93 and a heat sink 95. Heat can dissipate away from LED package 70 by moving in a path and pass from heat transfer material 72 into solder 92 and then into PCB 90. Heat can then pass from PCB 90 and into heat transfer layer 93 which can comprise any material that is thermally conductive. Heat can continue on a path which passes from heat transfer layer 93 into heat sink 95 which can pass heat into ambient air for example. Heat sink 95 can comprise any material capable of conducting heat, and which ideally would not increase in temperature when heat is applied.

FIGS. 10A-10F illustrate side, top perspective, and bottom perspective views of a further embodiment of a light emitting diode package 120. This embodiment illustrates using another LED packaging technology utilizing methods such as low temperature co-fired ceramic (LTCC) instead of molding about lead portions from a leadframe. For example, the body can comprise an insulating member, such as a submount 122. An active layer 118 can be disposed on a top surface of the submount 122. Active layer 118 can comprise a light emitting device connected to electrical components. For example, light emitting device can comprise an LED chip 110 electrically connected to electrical components comprising an anode 114 and a cathode 112. Anode 114 and cathode 112 can comprise a metal or any other suitable electrically conductive material known in the art. LED chip 110 can optionally be coated with a phosphor for producing a desired light wavelength spectrum. Active layer 118 can be electrically and thermally connected to the body, or submount 122. Submount 122 can comprise one of many different materials including those which are electrically insulating. Suitable materials can comprise for example, ceramic materials including aluminum oxide, aluminum nitride, or organic insulating materials such as polyimide (PI) and polyphthalamide (PPA).

An optical element or lens 116 can be disposed over the top surface of the submount 122 and enclose LED 110 and at least a portion of active layer 118. Lens 116 can comprise a molded lens of any suitable size and shape for producing a desired light output. Anode 114 and cathode 112 can electrically couple to electrical elements of the LED package 120. Electrical elements can comprise first and second surface pads 124 and 128, to which anode 114 and cathode 112 can electrically connect, respectively. First and second surface pads 124 and 128 can be disposed or mounted on a bottom surface 130 of submount 122 or they can be flush with bottom surface 130. LED package 120 can further comprise a thermal element, for example a heat transfer material 126. Heat transfer material 126 can be disposed or mounted to bottom surface 130 of submount 122. Heat can dissipate from active layer 118 by extending through thermally conductive paths in submount 122. Heat transfer material 126 can comprise any thermally conductive material known in the art and can be disposed between the first and second surface pads 124 and 128.

Heat transfer material 126 can be substantially centrally and vertically aligned beneath LED chip 110. Heat transfer material 126 may not be in electrical contact with active layer 118 or first and second pads 124 and 128. Heat can pass into submount 122 directly below and around LED chip 110. Heat transfer material 126 can comprise any size and shape suitable to assist with the dissipation of heat by allowing the heat to spread where it can dissipate to an external source or substrate, for example a PCB having, for example, a heat sink. A bottom surface 132 of heat transfer material 126 can extend to a plane P1 which is further away in distance from bottom surface 130 of submount 122 than bottom surfaces of the electrical elements. For example, electrical elements can comprise first and second pads 124 and 128 having bottom surfaces 134 and 136 respectively. Bottom surfaces 134 and 136 can extend to a plane P2 that is closer in distance to bottom surface 130 of submount 122 than P1 or flush with bottom surface 130. In one embodiment, a suitable range for a distance between P1 to P2 can be from 0 μm to greater than 100 μm. In other embodiments, a suitable range for a distance between P1 and P2 can be from 25 μm to 50 μm, 50 μm to 100 μm, or greater than 100 μm. As previously described, this configuration enables adequate wetting of bottom surface 132 of heat transfer material 126 when soldered to a PCB. Improved heat dissipation and improved thermal properties of LED package 120 are thereby accomplished.

Figure 10A:
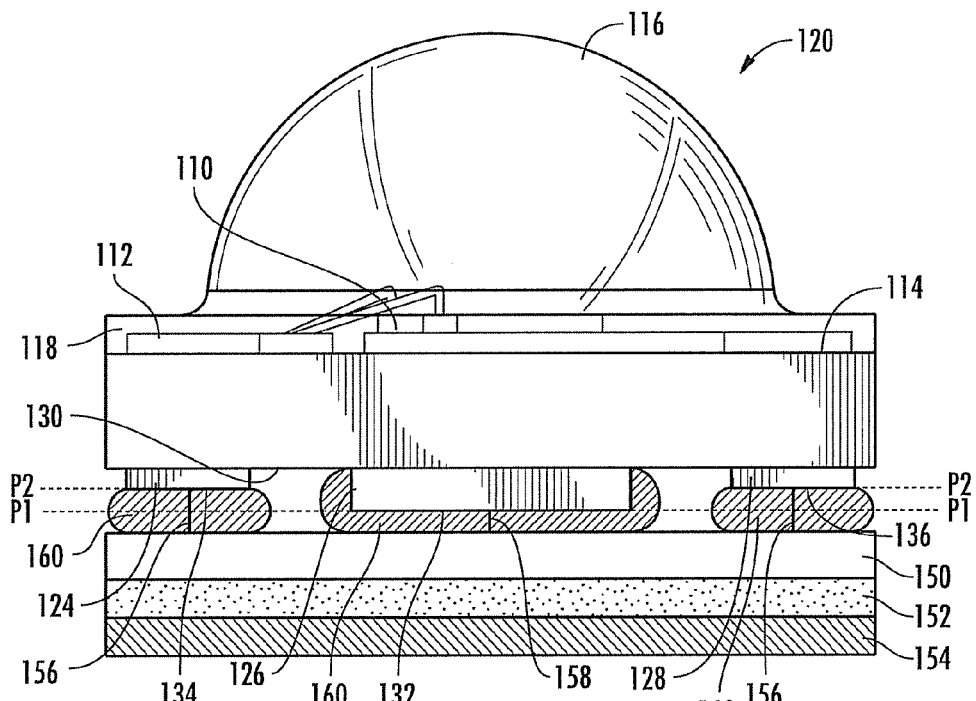
FIG. 10A illustrates a side view of an embodiment of an LED package with a heat transfer material according to the subject matter herein.
Figure 10B:
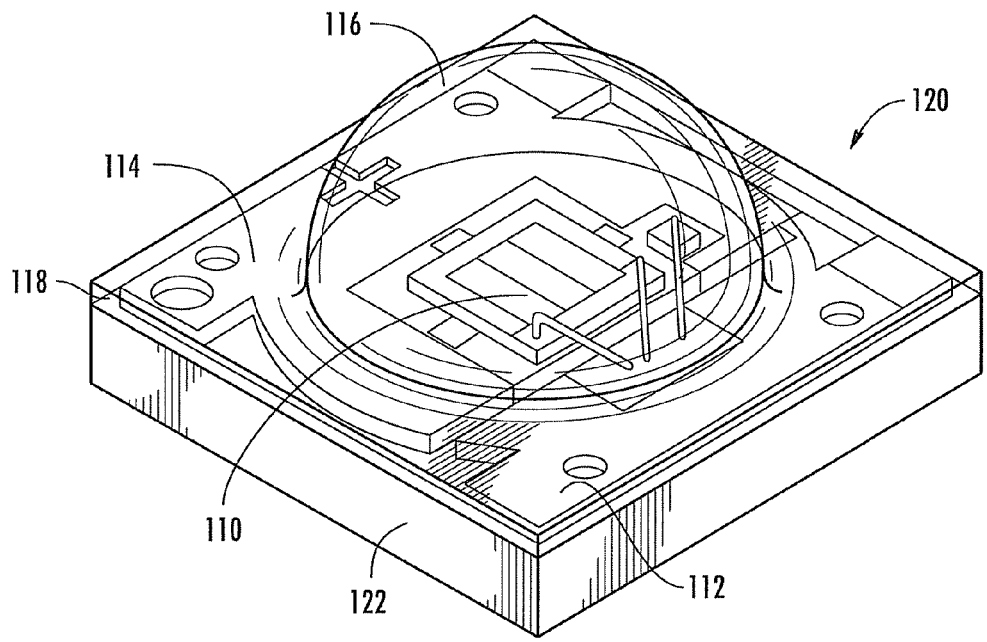
FIG. 10B illustrates a top perspective view of an embodiment of an LED package according to FIG. 10A.
Figure 10C:
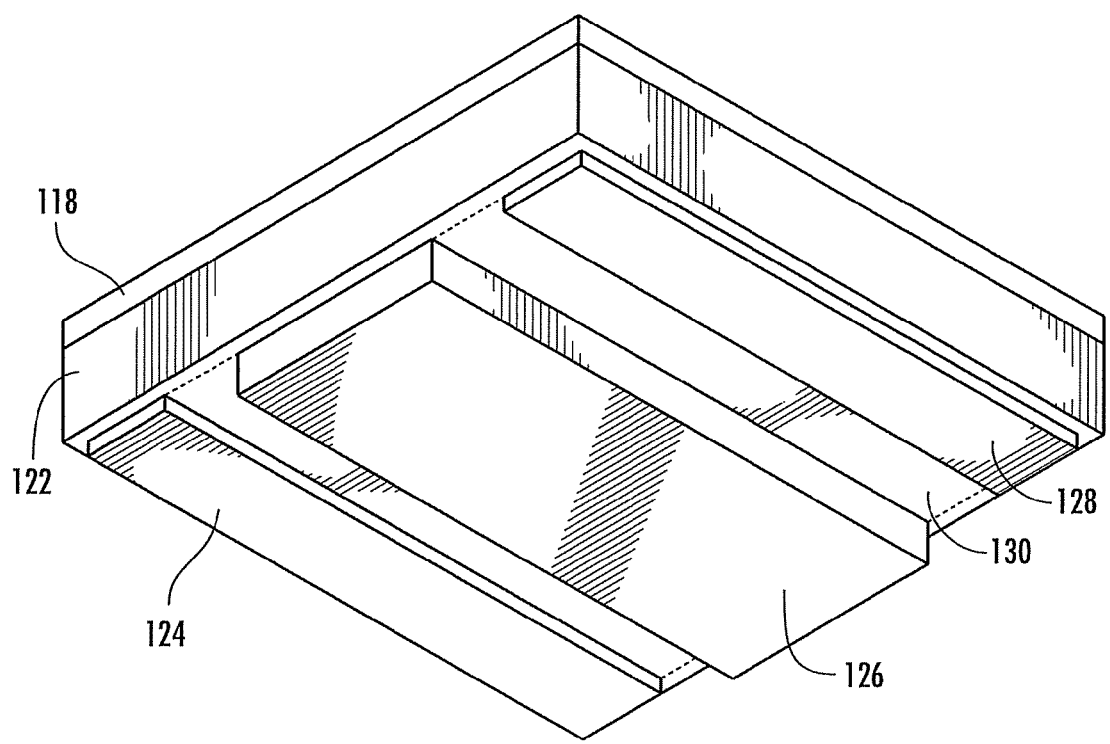
FIG. 10C illustrates a bottom perspective view of an embodiment of an LED package according to FIG. 10A.

As illustrated by FIG. 10A, LED package 120 can be mounted to an external source, such as a PCB 150. PCB 150 can be an intermediate substrate located above a heat transfer layer 152 and a heat sink 154. Solder 160 can be used to attach LED package 120 to PCB 150. For example, once wetted by solder 160, any gap between the thermal element, that is, a gap 158 between bottom surface 132 of heat transfer material 126 and PCB 150 will be smaller than a gap 156 between the electrical elements, that is, the bottom surfaces 134 and 136 of respective first and second surface pads 124 and 128 and PCB 30. Having heat transfer material 126 in this configuration can increase the likelihood that solder 160 will wet the entire bottom surface 132 of heat transfer material 126 and can allow formation of an adequate thermal contact between LED package 120 and PCB 150. Upon solidification of the solder 160, the thermal contact between heat transfer material 126 and PCB 150 can comprise a solder joint that is essentially free of voids, thereby being more reliable. This can increase the likelihood of obtaining better heat transfer from heat transfer material 126 to PCB 150. For example, if LED package 120 were to be sheared from PCB 150, a footprint of the solder joint on the backside of the package and PCB 30 would preferably be free of voids, thereby being more reliable. This can increase the likelihood of obtaining better heat transfer from heat transfer material 126 to PCB 150. For example, if LED package 120 were to be sheared from PCB 150, a footprint of the solder joint on the backside of the package and PCB 30 would preferably be essentially free of voids. A small number, or substantially zero voids indicates better wetting of the thermal element, and a better, more reliable thermal contact between heat transfer material 126 of LED package 120 and PCB 150. Bottom surface 132 of heat transfer material 126 as well as bottom surfaces 134 and 135 of portions of first and second surface pads 124 and 128, respectively are thus all wetted by solder 160 and connected to PCB 150 upon solidification of solder 160.

Figure 10D:
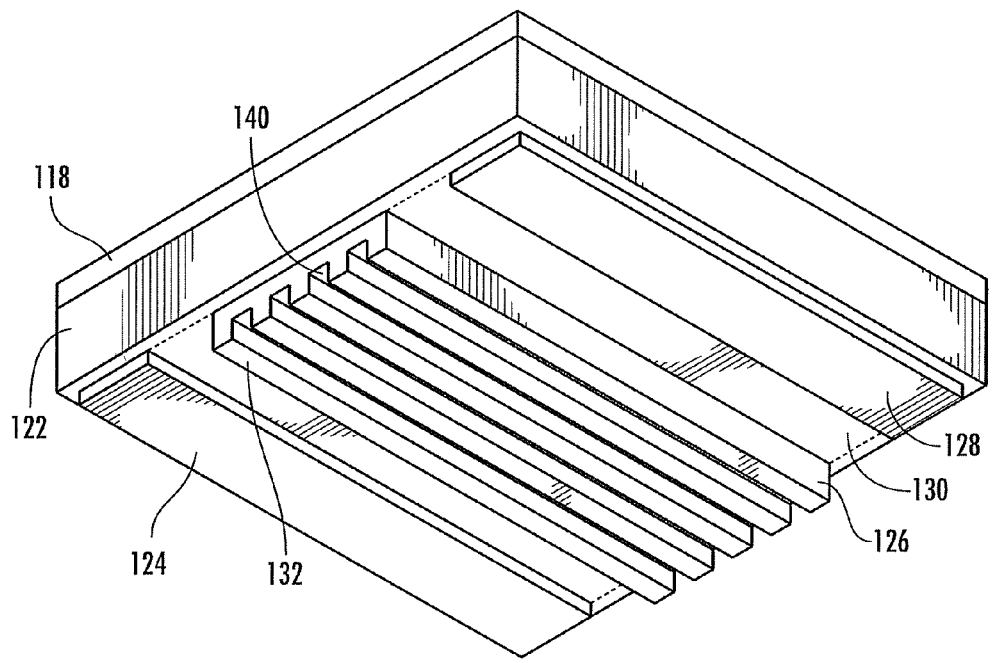
FIG. 10D-10F illustrate bottom perspective views of embodiments of an LED package with grooves according to the subject matter herein.
Figure 10E:
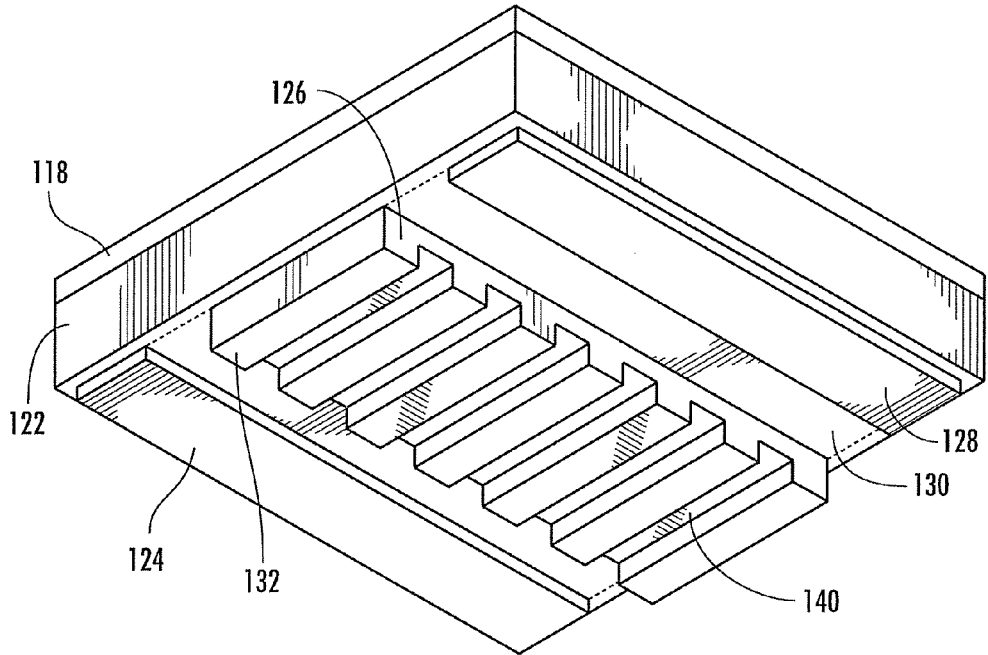
Figure 10F:
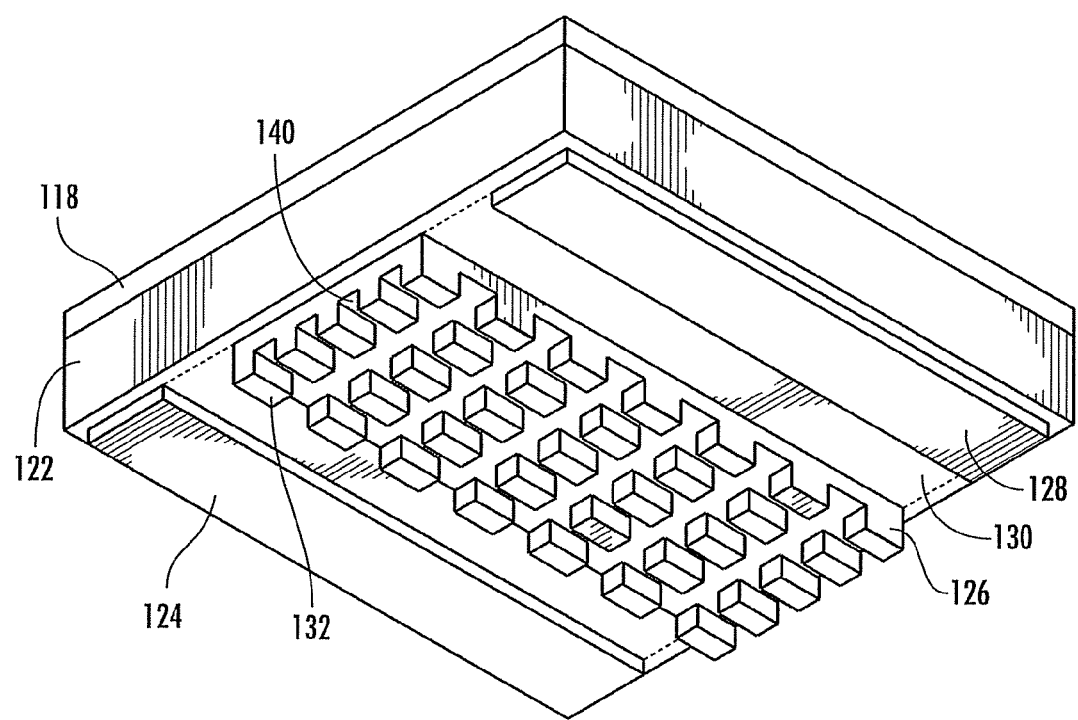

Referring now to FIGS. 10D, 10E and 10F, bottom surface 132 of heat transfer material 126 can comprise grooves 140 which can further improve heat dissipation of LED package 120 by breaking up small voids which may form when LED package 120 is attached to PCB 150 (FIG. 10A). As illustrated by FIG. 10D, one or more grooves 140 can be defined in bottom surface 132 of heat transfer material 126 and extend in a linear direction along a first length. Where a plurality of grooves 140 are present, they can extend parallel to one another. As illustrated by FIG. 10E, grooves 140 can extend in a linear direction along a second length which can be in a direction orthogonal with the first length. As illustrated by FIG. 10F, grooves 140 can extend in more than one direction, such as for example as shown in FIG. 10F where grooves 140 extend in two directions that can be orthogonal to one another forming a plurality of island structures that are surrounded on at least two or more, and even all four, sides by grooves 140. Grooves such as grooves 140 can extend in any suitable direction even other than the directions shown in FIGS. 10D-10F. Additionally, the island structures that can be formed between the grooves can be any suitable configuration, such as for example and without limitation, rectangular, square, circular post type configuration, or any other suitable configuration.

Embodiments of the present disclosure shown in the drawings and described above are exemplary of numerous embodiments that can be made within the scope of the appended claims. It is contemplated that the configurations of LED packages having improved solder reliability for heat transfer, and methods of making the same can comprise numerous configurations other than those specifically disclosed.

What is claimed is:

1. A light emitting device package, the package comprising:
   a body having a recess with a thermal element disposed in the recess, and the body having at least one electrical element wherein the at least one electrical and thermal elements have bottom surfaces;
   at least one light emitting device mounted on a top surface of the thermal element and electrically connected to the electrical element; and
   the bottom surface of the electrical element extending away from the body a first distance and the bottom surface of the thermal element extending away from the body a second distance that is greater than the first distance.

2. The light emitting device package of claim 1, wherein the thermal element comprises a base portion and a protruding portion.

3. The light emitting device package of claim 1, wherein the second distance is greater than the first distance by from 0 µm to 100 µm.

4. The light emitting device package of claim 1, wherein the second distance is greater than the first distance by greater than 100 µm.

5. The light emitting device package of claim 1, wherein the thermal element comprises a first exposed portion located above the bottom surface of the electrical element and a second exposed portion located below the bottom surface of the electrical element.

6. The light emitting device package of claim 1, wherein the electrical element comprises a first portion extending vertically downward from the body, and a second portion extending in a linear direction away from the body and away from the recess.

7. The light emitting device package of claim 1, wherein the thermal element comprises a first exposed portion located above the second plane and a second exposed portion located below the second plane.

8. The light emitting device package of claim 1, wherein the electrical element extends to a first plane and the thermal element extends to a second plane which is further away from the body than the first plane.

9. A light emitting device package, the package comprising:
a body having at least one thermal element and at least one electrical element, the at least one electrical and thermal elements having bottom surfaces wherein the electrical element comprises a bend and a first portion which is substantially orthogonal to a second portion;
at least one light emitting device mounted on a top surface of the thermal element and electrically connected to the electrical element; and
the bottom surface of the electrical element extending away from the body a first distance, and the bottom surface of the thermal element extending away from the body a second distance that is greater than the first distance.

10. The light package according to claim 9, wherein the electrical element comprises a J-bend type lead component.

11. The light package according to claim 10, wherein the first portion extends vertically down from the body and the second portion extends in a linear direction towards the body.

12. The light package according to claim 9, wherein the electrical element comprises a gull wing type lead component.

13. The light package according to claim 12, wherein the first portion extends vertically down from the body and the second portion extends in a linear direction away from the body.

14. The light package according to claim 9, wherein the thermal element comprises a first exposed portion located above the bottom surface of the electrical element and a second exposed portion located below the bottom surface of the electrical element.

15. The light emitting device package of claim 9, wherein the second distance is greater than the first distance by from about 0 µm to 100 µm.

16. The light emitting device package of claim 9, wherein the second distance is greater than the first distance by greater than 100 µm.

17. The light emitting device package of claim 9, wherein the electrical element extends to a first plane and the thermal element extends to a second plane which is lower than the first plane.

18. A molded leadframe light emitting device package, the package comprising:
a molded body having at least one thermal element and at least one electrical lead extending directly from a bottom surface of the molded body;
at least one light emitting device mounted on a top surface of the thermal element and electrically connected to the electrical element; and
the electrical lead extending away from the body a first distance and the thermal element extending away from the body a second distance that is greater than the first distance.

19. The light emitting device package according to claim 18, wherein the thermal element comprises an exposed portion flush with a first exterior lateral surface of the body.

20. The light emitting device package according to claim 19, wherein the electrical lead comprises an exposed portion flush with the first exterior lateral surface of the body.

21. The light emitting device package according to claim 18, wherein the thermal element comprises one or more grooves.

22. The light emitting device package of claim 18, wherein the second distance is greater than the first distance by from about 0 µm to 100 µm.

23. The light emitting device package of claim 18, wherein the second distance is greater than the first distance by greater than 100 µm.

24. The light emitting device package of claim 18, wherein the electrical lead extends to a first plane and the thermal element extends to a second plane which is lower than the first plane.

25. The light emitting device package of claim 18, wherein the thermal element and the electrical lead extend only from the bottom surface of the molded body.

26. A light emitting device package, the package comprising:
a body having at least one thermal element and at least one electrical element disposed on a bottom surface of the body, the at least one thermal and electrical elements having bottom surfaces;
at least one light emitting device mounted on a top surface of the body; and
the bottom surface of the electrical element extending away from the body a first distance and the bottom surface of the thermal element extending away from the body a second distance that is greater than the first distance, wherein the second distance is greater than the first distance by from about 0 µm to about 100 µm.

27. The light emitting device package according to claim 26, further comprising a lens.

28. The light emitting device package according to claim 26, wherein the second distance is greater than the first distance by greater than about 100 µm.

29. The light emitting device package according to claim 26, wherein the body comprises an insulating material.

30. The light emitting device package of claim 26, wherein the electrical element extends to a first plane and the thermal element extends to a second plane which is lower than the first plane.

31. A light emitting device package mounted to an external substrate comprising:
a body having at least one electrical element and at least one thermal element;

at least one light emitting device mounted on a top surface of the thermal element and electrically connected to the electrical element; and the external substrate comprising a notch configured to receive at least a portion of the at least one thermal element.

32. The light emitting device package according to claim 31, wherein the external substrate comprises a printed circuit board (PCB).

33. The light emitting device package according to claim 31, wherein a bottom surface of the electrical element extends away from the body a first distance and a bottom surface of the thermal element extends away from the body a second distance that is greater than the first distance.

34. The light emitting device package according to claim 32, wherein a smaller gap exists between a bottom surface of the thermal element and the external substrate than a larger gap that exists between a bottom surface of the electrical element and the PCB.

35. The light emitting device package according to claim 33, wherein the second distance is greater than the first distance by greater than 100 μm.

36. The light emitting device package according to claim 31, wherein the notch comprises a width and is configured for receiving at least a portion of the thermal element that substantially corresponds to the width of the notch.

37. The light emitting device package according to claim 31 wherein the notch extends partially through the substrate.

38. The light emitting device package according to claim 31 wherein the notch extends entirely through the substrate.

39. The light emitting device package according to claim 38 further comprising a heat sink and wherein the thermal element of the body extends through the notch of the substrate and is in thermal contact with the heat sink.

40. The light emitting device package according to claim 39 further comprising a heat transfer layer disposed adjacent the substrate and between the thermal element and the heat sink.

41. A light emitting device package, the package comprising:
    a body having at least one electrical element and at least one thermal element, the at least one electrical and thermal elements having bottom surfaces;
    at least one light emitting device mounted on a top surface of the thermal element and electrically connected to the electrical element; and
    the thermal element having a first exposed portion disposed above a bottom surface of the electrical element and a second exposed portion disposed below the bottom surface of the electrical element, and the bottom surface of the electrical element extending away from the body a first distance and the bottom surface of the thermal element extending away from the body a second distance that is greater than the first distance.

42. The light emitting device package according to claim 41, wherein the body comprises a recess and at least a portion of the thermal element is disposed in the recess.

43. The light emitting device package according to claim 41, wherein the at least one light emitting device comprises a light emitting diode (LED).

44. The light emitting device package according to claim 41, wherein the body comprises at least two electrical elements having top and bottom surfaces.

45. The light emitting device package according to claim 44, wherein the electrical elements comprise portions which extend outside of the body to form an electrical contact with an external source.

46. The light emitting device package according to claim 45, wherein the external source comprises a printed circuit (PCB), and the electrical contact is formed by wetting the bottom surface of the electrical elements with solder.

47. The light emitting device package according to claim 41, wherein the bottom surface of the thermal element connects to a printed circuit board (PCB).

48. The light emitting device package according to claim 47, wherein the bottom surface of the thermal element connects to the PCB by wetting the bottom surface of the thermal element with solder.

49. The light emitting device package according to claim 41, wherein the body comprises a molded plastic body with plastic molded about the at least one thermal and electrical elements.

50. The light emitting device package according to claim 44, wherein the electrical elements protrude from the body and extend away from the body in opposing directions.

51. The light emitting device package according to claim 44, wherein the electrical elements extend from the body and toward each other.

52. The light emitting device package according to claim 44, wherein the electrical elements extend from a bottom surface of the body.

53. The light emitting device package according to claim 41, wherein the bottom surface of the thermal element is attached to a PCB by wetting the bottom surface of the thermal element with solder to form a solder joint.

54. The light emitting device package according to claim 53, wherein the solder comprises a metal paste comprising gold, tin, silver, lead, copper, flux, and any combination thereof.

55. The light emitting device package according to claim 54, wherein the solder joint is essentially free of voids.

56. The light emitting device package according to claim 55, wherein the package has improved heat transfer between the bottom surface of the thermal element and the PCB.

* * * * *